US012532420B2

(12) United States Patent
Hisatsugu et al.

(10) Patent No.: US 12,532,420 B2
(45) Date of Patent: Jan. 20, 2026

(54) DISPLAY DEVICE

(71) Applicant: DENSO CORPORATION, Kariya (JP)

(72) Inventors: Shinsuke Hisatsugu, Kariya (JP); Yasuhiro Kobayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 210 days.

(21) Appl. No.: 18/240,693

(22) Filed: Aug. 31, 2023

(65) Prior Publication Data

US 2023/0413458 A1 Dec. 21, 2023

Related U.S. Application Data

(63) Continuation of application No. PCT/JP2022/002136, filed on Jan. 21, 2022.

(30) Foreign Application Priority Data

Mar. 5, 2021 (JP) ................................ 2021-035486

(51) Int. Cl.
*H05K 5/02* (2006.01)
*B60K 35/22* (2024.01)
(Continued)

(52) U.S. Cl.
CPC ........... *H05K 5/0209* (2022.08); *B60K 35/22* (2024.01); *B60K 35/60* (2024.01); *B60K 37/00* (2013.01);
(Continued)

(58) Field of Classification Search
CPC .............. H05K 5/0209; B60R 11/0235; B60R 2011/0005; B60K 35/60; B60K 2360/691; B60K 35/22
(Continued)

(56) References Cited

U.S. PATENT DOCUMENTS 3,828,215 A * 8/1974 Bilsback ................ H01J 17/49 313/50
5,537,343 A * 7/1996 Kikinis .................. G06F 1/183 361/679.41
(Continued)

FOREIGN PATENT DOCUMENTS

JP 2003337556 A 11/2003
JP 2015217815 A 12/2015
(Continued)

*Primary Examiner* — Anatoly Vortman
(74) *Attorney, Agent, or Firm* — Harness, Dickey & Pierce, P.L.C.

(57) ABSTRACT

A display device includes an image display unit, a display case, and a heat insulating part. The image display unit has a display surface that displays an image and a display back surface opposite to the display surface. The display case has a case opposing surface opposing the display back surface and covering the display back surface. The heat insulating part is disposed between the display back surface and the case opposing surface to restrict heat from transferring from the display case to the image display unit. The heat insulating part being elastically deformed or flexibly stretched and deformed in accordance with a relative displacement of the image display unit with respect to the display case. The image display unit is fixed to the case opposing surface through the heat insulating part.

8 Claims, 34 Drawing Sheets

(51) Int. Cl.
*B60K 35/60* (2024.01)
*B60K 37/00* (2006.01)
*B60R 11/02* (2006.01)
*H05K 7/20* (2006.01)
*B60R 11/00* (2006.01)

(52) U.S. Cl.
CPC .... *B60R 11/0235* (2013.01); *B60K 2360/691* (2024.01); *B60R 2011/0005* (2013.01)

(58) Field of Classification Search
USPC .................................................... 361/679.46
See application file for complete search history.

(56) References Cited

U.S. PATENT DOCUMENTS

| | | | | |
|---|---|---|---|---|
| 5,982,617 | A * | 11/1999 | Haley | G06F 1/203 361/679.46 |
| 6,052,280 | A * | 4/2000 | Dilley | G06F 1/203 174/15.2 |
| 6,097,597 | A * | 8/2000 | Kobayashi | H01L 23/427 361/717 |
| 6,104,451 | A * | 8/2000 | Matsuoka | G06F 1/16 361/679.48 |
| 6,172,871 | B1 * | 1/2001 | Holung | G06F 1/1632 165/104.33 |
| 6,246,459 | B1 * | 6/2001 | Simhambhatla | G02F 1/133385 349/149 |
| 6,324,055 | B1 * | 11/2001 | Kawabe | G06F 1/1616 361/705 |
| 6,504,713 | B1 * | 1/2003 | Pandolfi | G06F 1/1601 345/87 |
| 6,816,371 | B2 * | 11/2004 | Agata | G06F 1/203 361/679.48 |
| 7,205,717 | B2 * | 4/2007 | Cok | H10K 50/87 313/512 |
| 7,205,718 | B2 * | 4/2007 | Cok | H10K 50/87 313/512 |
| 7,218,521 | B2 * | 5/2007 | Kim | H05K 7/20 345/905 |
| 7,352,582 | B2 * | 4/2008 | Yokoyama | H10K 59/8721 361/679.48 |
| 7,369,400 | B2 * | 5/2008 | Bang | H05K 7/20963 361/679.27 |
| 7,423,878 | B2 * | 9/2008 | Kim | H05K 7/20963 345/905 |
| 7,436,668 | B2 * | 10/2008 | Bae | G06F 1/1601 361/704 |
| 7,481,567 | B2 * | 1/2009 | Cho | G02B 6/0085 362/561 |
| 7,495,918 | B2 * | 2/2009 | Lee | H05K 7/20963 349/59 |
| 7,561,427 | B2 * | 7/2009 | Jeong | H05K 7/20963 361/690 |
| 7,605,525 | B2 * | 10/2009 | Kim | G06F 1/1601 313/46 |
| 8,320,119 | B2 * | 11/2012 | Isoshima | H05K 7/20972 165/104.34 |
| 8,625,282 | B2 * | 1/2014 | Chen | H05K 7/2039 361/710 |
| 2014/0355236 | A1 * | 12/2014 | Kobayashi | B60Q 3/10 362/23.01 |
| 2015/0328990 | A1 | 11/2015 | Nakajima et al. | |
| 2021/0354560 | A1 * | 11/2021 | Matsuoka | G06F 1/1601 |

FOREIGN PATENT DOCUMENTS

| | | | |
|---|---|---|---|
| WO | WO-2020195111 | A1 | 10/2020 |
| WO | WO-2022185768 | A1 | 9/2022 |
| WO | WO-2022185769 | A1 | 9/2022 |

* cited by examiner

<COMPARATIVE EXAMPLE>

<COMPARATIVE EXAMPLE>

<COMPARATIVE EXAMPLE>

<COMPARATIVE EXAMPLE>

DISPLAY DEVICE

CROSS-REFERENCE TO RELATED APPLICATIONS

The present application is a continuation application of International Patent Application No. PCT/JP2022/002136 filed on Jan. 21, 2022, which designated the U.S. and claims the benefit of priority from Japanese Patent Application No. 2021-035486 filed on Mar. 5, 2021. The entire disclosures of all of the above applications are incorporated herein by reference.

TECHNICAL FIELD

The present disclosure relates to a display device.

BACKGROUND

As an example of a display device that displays an image, a display device including a display and a back cover has been known. In such a display device, the display includes a display surface that displays an image, and the back cover is disposed on the back surface side of the display.

SUMMARY

The present disclosure describes a display device. In an aspect, a display device that displays an image includes an image display unit, a display case, and a heat insulating part. The image display unit has a display surface for displaying an image and a display back surface on a side opposite to the display surface. The display case has a case opposing surface opposing a display back surface and covering the display back surface. The heat insulating part is disposed between the display back surface and the case opposing surface to restrict heat from transferring from the display case to the image display unit. The heat insulating part elastically deforms or flexibly stretches and deforms according to a relative displacement of the image display unit with respect to the display case. The image display unit is fixed to the case opposing surface through the heat insulating part.

DETAILED DESCRIPTION

Figure 1:
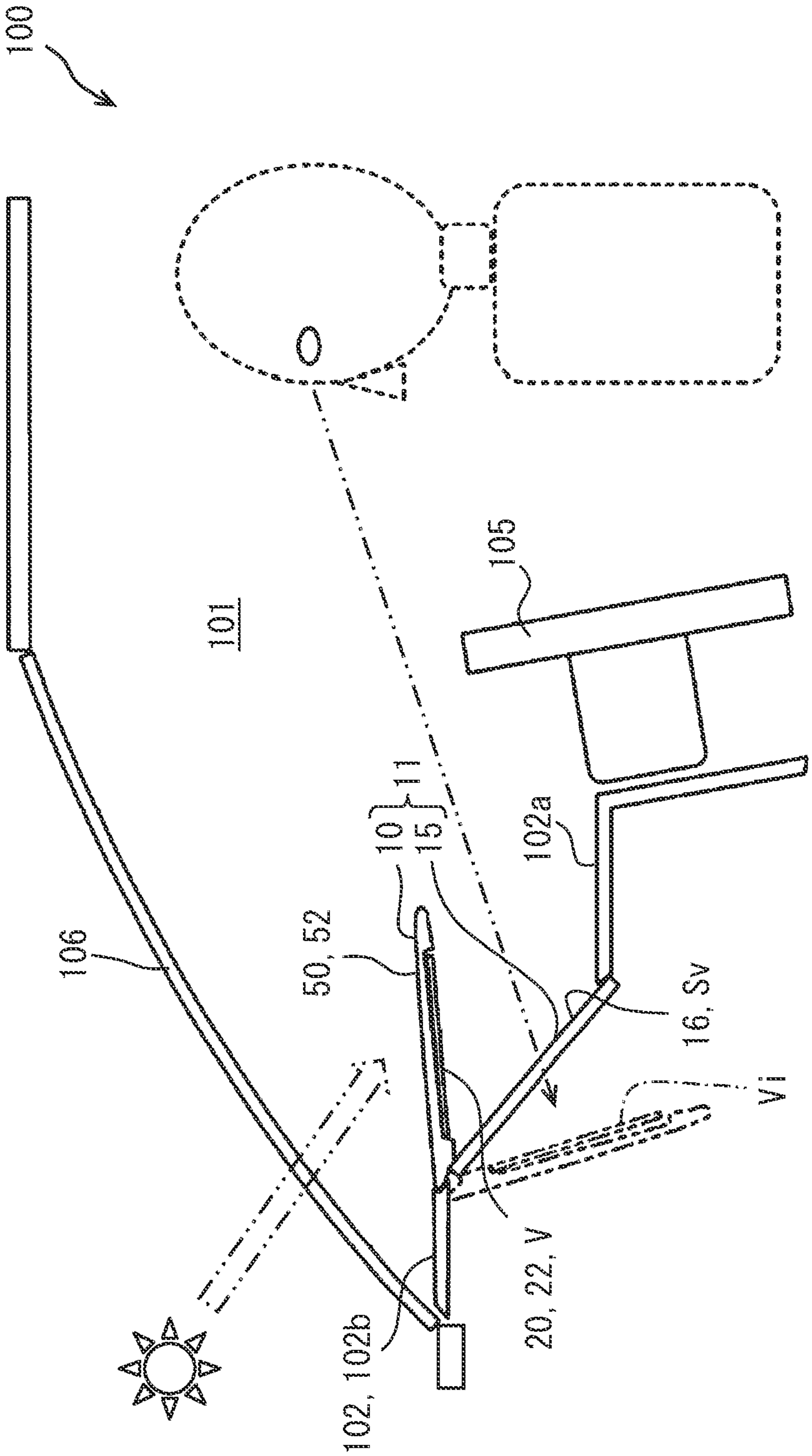
FIG. 1 is a diagram illustrating a virtual image display device in a state of being mounted on a vehicle according to a first embodiment.

In a display device having a display and a back cover which is disposed on a back surface side of the display, it is considered that when the back surface of the back cover is irradiated with external light such as sunlight, external light heat due to the external light may be applied to the display via the back cover. When the temperature of the display excessively rises due to the external light heat, there is a concern that an abnormality occurs in the display.

The present disclosure provides a display device which is capable of suppressing occurrence of abnormality in an image display unit.

A plurality of aspects disclosed in this specification adopt technical means different from each other to achieve respective objectives.

According to an aspect of the present disclosure, a display device, which displays an image, includes an image display unit, a display case, and a heat insulating part. The image display unit has a display surface for displaying an image and a display back surface on a side opposite to the display surface. The display case has a case opposing surface opposing a display back surface and covering the display back surface. The heat insulating part is disposed between the display back surface and the case opposing surface to restrict heat from transferring from the display case to the image display unit. The heat insulating part elastically deforms or flexibly stretches and deforms according to a relative displacement of the image display unit with respect to the display case. Further, the image display unit is fixed to the case opposing surface through the heat insulating part.

According to the above aspect, the heat insulating part is disposed between the display back surface and the case opposing surface. In such a configuration, even if the back surface of the display case is irradiated with external light such as sunlight, the heat insulating part can suppress external light heat due to the external light from being transmitted from the display case to the image display unit. Therefore, the occurrence of an abnormality in the image display unit due to an excessive rise in the temperature of the image display unit due to external light heat can be suppressed by the heat insulating part.

Furthermore, the heat insulating part is elastically deformed or flexibly stretch deformed in accordance with the relative displacement of the image display unit with respect to the display case, and the image display unit is fixed to the case opposing surface through the heat insulating part. In such a configuration, even if vibrations are applied to the display case, the heat insulating part can suppress the vibrations from being transmitted from the display case to the image display unit. Therefore, the occurrence of abnormality in the image display unit accompanying the vibrations of the display case can be suppressed by the heat insulating part.

As described above, the occurrence of abnormality in the image display unit can be suppressed.

Hereinafter, a plurality of modes for carrying out the present disclosure will be described with reference to the drawings. In each mode, the same reference numerals are denoted to portions corresponding to matters described in the preceding mode in each mode, and redundant description may be omitted. In a case where only a part of the configuration is described in each mode, antecedently described other modes can be applied to other parts of the configuration. It is possible not only to combine the parts that are explicitly indicated as being specifically combinable in each embodiment, but also to partially combine the embodiments even if not explicitly described as long as there is no particular problem in the combination.

First Embodiment

An image display device 10 illustrated in FIG. 1 is mounted on a vehicle 100. The image display device 10 is provided on an instrument panel 102 in a state of being exposed to a vehicle interior 101 of the vehicle 100. The instrument panel 102 is an instrument panel and is provided in front of a seat such as a driver's seat. The instrument panel 102 is an interior panel that forms the interior of the vehicle interior 101. The interior panel forms a finished surface subjected to finishing processing in the vehicle interior 101. A steering 105 is provided between the driver's seat and the instrument panel 102. A front windshield 106 is provided in front of the driver's seat in addition to the steering 105. The front windshield 106 is located on the upper side of the instrument panel 102. The front of the seat is the front of the vehicle 100. Examples of the windshield of the vehicle 100 include a side windshield in addition to the front windshield 106.

The image display device 10 displays various types of information as an image V. The image display device 10 corresponds to a display device. The various types of information include, for example, vehicle information and travel information. The vehicle information is information indicating a power accumulation amount of an in-vehicle battery and the like, and the travel information is information indicating a travel speed, a travel mode, a travel distance, and the like of the vehicle 100. Furthermore, the various types of information include navigation information, entertainment information, air-conditioning information, camera information, and the like. For example, the navigation information is information indicating a current value of the vehicle 100, information for guiding a route from a current location to a destination, or the like. The camera information is information imaged by an imaging device such as a camera. The camera information includes information obtained by imaging the periphery of the vehicle such as the rear side of the vehicle 100.

The image display device 10 includes a display surface 22, and can display the image V on the display surface 22. The display surface 22 outputs image light to display the image V. The image display device 10 includes a hood back surface 52 in addition to the display surface 22. The image display device 10 is formed in a plate shape as a whole. The hood back surface 52 faces the side opposite to the display surface 22 in the device thickness direction. The device thickness direction is a thickness direction of the image display device 10, and is a vertically extending direction in the present embodiment. The device thickness direction is a direction orthogonal to the display surface 22.

The image display device 10 is included in the virtual image display device 11 together with a reflecting mirror 15. The virtual image display device 11 is mounted on the vehicle 100, and displays the image V as a virtual image Vi. The reflecting mirror 15 is a reflection member that reflects image light, and may be referred to as a reflecting mirror. The reflecting mirror 15 has a reflection surface 16, and reflects the image light by the reflection surface 16 to display the virtual image Vi. The reflection surface 16 is included in one of the pair of plate surfaces of the reflecting mirror 15. The reflecting mirror 15 is a member that reflects the image light entering the reflection surface 16 between transmission and reflection. The reflecting mirror 15 corresponds to a virtual image display unit that displays a virtual image by image light.

The reflecting mirror 15 is provided on the instrument panel 102 in a state in which the reflection surface 16 is exposed to the vehicle interior 101. The reflecting mirror 15 is fixed to the instrument panel 102 in a state of being embedded in the instrument panel 102. The reflection surface 16 is facing obliquely upward so as to face the seat side. The occupant sitting on the seat can easily visually recognize the reflection surface 16.

The image display device 10 is provided such that the image light from the display surface 22 is reflected by the reflection surface 16 toward the seat. The image display device 10 is provided on the upper side of the reflecting mirror 15 in a state where the display surface 22 is facing downward and the hood back surface 52 is facing upward. The display surface 22 and the reflection surface 16 are in a state of facing each other. For the occupant sitting on the seat, the virtual image Vi displayed by the image light appears as if on the far side of the reflection surface 16.

In the virtual image display device 11, the occupant as a viewer does not directly view the display surface 22, but indirectly views the display surface 22 by visually recognizing the reflection surface 16. In the present embodiment, the reflection surface 16 is the visual recognition surface Sv that is visually recognized by the occupant. The occupant can visually recognize the virtual image Vi by visually recognizing the reflection surface 16 which is the visual recognition surface Sv.

The instrument panel 102 has a near portion 102*a* and a far portion 102*b*. The near portion 102*a* and the far portion 102*b* are arranged side by side in the vehicle front-rear direction. The vehicle front-rear direction is a front-rear direction for the vehicle 100. Assuming the seat side of the instrument panel 102 is referred to as a near side, the near portion 102*a* forms a near side end portion of the instrument panel 102. The far portion 102*b* forms a far side end portion of the instrument panel 102. The far portion 102*b* is located higher than the near portion 102*a*. The reflecting mirror is disposed between the near portion 102*a* and the far portion 102*b*. The reflecting mirror 15 is in a state of being bridged across the near portion 102*a* and the far portion 102*b* such that reflection surface 16 faces obliquely upward.

The image display device 10 protrudes from the far portion 102*b* toward the near side. The image display device 10 is fixed to the far portion 102*b* and is cantilevered by the far portion 102*b*. The far side end portion of the image display device 10 is a base end portion fixed to the far portion 102*b*. The near side end portion of the image display device 10 is a distal end portion disposed above the near portion 102*a*. The display surface 22 is inclined with respect to the reflection surface 16. A separation distance between the display surface 22 and the reflection surface 16 increases toward a position closer to the near side end portion of the image display device 10. The display surface 22 extends in the horizontal direction or a direction slightly inclined with respect to the horizontal direction.

The image display device 10 is provided between the reflection surface 16 and the front windshield 106, and covers the reflection surface 16 from above. The hood back surface 52 faces the front windshield 106. When sunlight is transmitted through the front windshield 106 and enters the vehicle interior 101, the sunlight easily hits the hood back surface 52 but hardly hits the reflection surface 16. The occupant can easily visually recognize the virtual image Vi on the visual recognition surface Sv because the sunlight does not hit the reflection surface 16 which is the visual recognition surface Sv.

Figure 2:
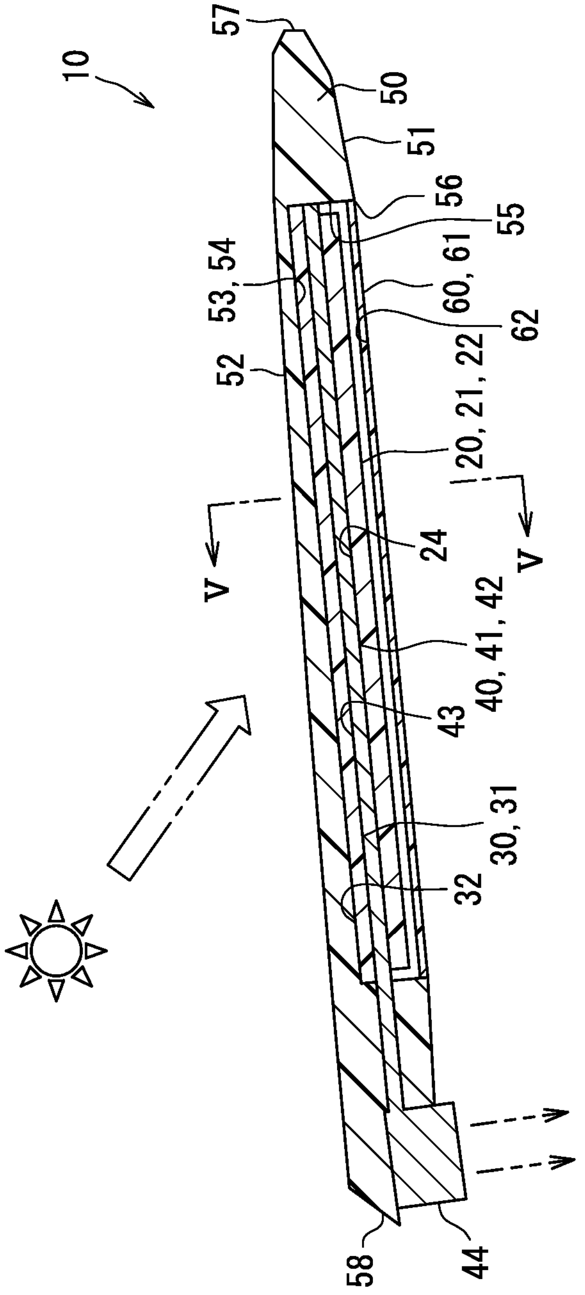
FIG. 2 is a diagram illustrating a longitudinal cross-sectional view of an image display device.

As illustrated in FIG. 2, the image display device 10 includes a display 20, a heat insulating part 30, a heat dissipating part 40, a visor hood 50, and a hood cover In the image display device 10, the display 20, the heat insulating part 30, and the heat dissipating part 40 are included in a display unit 70 to be described later. The display 20 includes a display surface 22 and a display back surface 24.

The display 20 is formed in a plate shape and has a pair of plate surfaces. In the display 20, one plate surface is the display front surface 21, and the other plate surface is the display back surface 24. The display front surface 21 has a display surface 22 and a frame surface 23 (see FIG. 3). The display surface 22 has a horizontally long rectangular shape. The frame surface 23 has a rectangular frame shape and extends along the outer peripheral edge of the display surface 22. The display 20 can emit image light from the display surface 22. The image light is not emitted from the frame surface 23. The display surface 22 is a display area where the image V is displayed, and the frame surface 23 is a non-display area where the image V is not displayed. The display 20 corresponds to an image display unit, and the display back surface 24 corresponds to a display back surface. The display 20 may be referred to as a display.

The reflecting mirror 15 displays the image Von the display surface 22 as a virtual image Vi, and displays the frame surface 23 as a virtual image V23 (not illustrated). The virtual image Vi of the image V is displayed by image light, whereas the virtual image V23 of the frame surface 23 is displayed simply by the frame surface 23 reflecting in the reflecting mirror 15. For this reason, for the occupant, the virtual image Vi displaying the image V stands out more than the virtual image V23 reflecting the frame surface 23. For example, the virtual image V23 is only slightly displayed so as to be hardly visually recognized by the occupant.

The color of the frame surface 23 is a color that makes the virtual image V23 less conspicuous. For example, the color of the frame surface 23 is black. Furthermore, the color of the frame surface 23 may be the same as or similar to the color of the display surface 22 in an off state in which the display surface 22 does not display the image V. Moreover, the color of the frame surface 23 may be a color lower than the color of the display surface 22 when at least one of saturation and brightness is in the off state. In addition, the color of the frame surface 23 may be the same color as or a similar color to the background among various types of information and the background included in the image V.

The display 20 is a self-luminous display unit. The display 20 includes, for example, an organic EL display. The organic EL display includes an organic light emitting diode. The organic light emitting diode is sometimes referred to as an OLED, and the OLED is an abbreviation for Organic Light-Emitting Diode. The display 20 includes a plurality of display elements such as organic EL elements. The plurality of display elements are arranged in a matrix form along the display surface 22, each of which emits light to be the image light.

The display 20 does not require a backlight as a light source as it is self-luminous. In the display 20 configured without including the backlight in this manner, the black portion of the image V can be displayed by stopping the light emission of the light emitting element. On the other hand, unlike the present embodiment, in the display with the backlight configured by including the backlight, it can be considered that light of the backlight slightly leaks from the black portion of the image V. When light of the backlight leaks even slightly from the black portion in the image V, it is considered that the black portion or the periphery thereof looks whitish.

The visor hood 50 accommodates the display 20, the heat insulating part and the heat dissipating part 40 in a state in which the image light of the display surface 22 can be emitted toward the reflecting mirror 15. The visor hood 50 is formed of a resin material or the like and has a light blocking property. The visor hood 50 is formed in a plate shape as a whole. A thickness direction of the visor hood 50 is a device thickness direction. The visor hood 50 covers the display back surface 24 of the display 20. The visor hood 50 corresponds to a display case and may be referred to as a housing case or a meter hood. The visor hood 50 includes a hood front surface 51 in addition to a hood back surface 52. The visor hood 50 is formed in a plate shape as a whole and has a pair of plate surfaces. In the visor hood 50, one plate surface is the hood back surface 52, and the other plate surface is the hood front surface 51. The hood back surface 52 corresponds to the back surface of the display case.

The visor hood 50 includes a hood recess 53 provided in the hood front surface 51. The hood recess 53 is a recess recessed toward the hood back surface 52 in the hood front surface 51. The hood recess 53 is opened toward the side opposite to the hood back surface 52. The hood recess 53 is provided at a position spaced apart to the inner side from the outer peripheral edge of the hood front surface 51. The hood front surface 51 extends along the outer peripheral edge of the hood recess 53 and has a frame shape. The hood recess 53 forms a recessed opening 56 in the hood front surface 51. The recessed opening 56 is an opening formed by an open end of the hood recess 53.

The inner surface of the hood recess 53 includes a recessed bottom surface 54 and a recessed wall surface 55. The recessed bottom surface 54 is a bottom surface of the hood recess 53 and faces a side opposite to the hood back surface 52 in the device thickness direction. The recessed bottom surface 54 extends along the hood back surface 52. The recessed wall surface 55 extends along the outer peripheral edge of the recessed opening 56. The recessed wall surface 55 is bridged across an outer peripheral edge of the recessed bottom surface 54 and an inner peripheral edge of the hood front surface 51 in the device thickness direction.

The display 20 is accommodated in the hood recess 53 in a state in which the display surface 22 faces the side opposite to the recessed bottom surface 54. The recessed bottom surface 54 opposes the display back surface 24 and corresponds to a case opposing surface. The recessed bottom surface 54 extends along the display back surface 24. The visor hood 50 is in a state in which the display 20 is covered from the display back surface 24 side. The visor hood 50 is disposed between the display 20 and the front windshield 106 and functions as a light blocking plate. Sunlight traveling toward the display 20 through the front windshield 106 is blocked by the visor hood 50. Therefore, the visor hood 50 prevents the display 20 from directly receiving solar radiation.

The visor hood 50 includes a hood distal end portion 57 and a hood basal end portion 58. The hood distal end portion 57 forms a distal end portion of the image display device 10, and the hood basal end portion 58 forms a basal end portion of the image display device 10. The visor hood 50 is fixed to the far portion 102*b* and protrudes out in an eaves shape from the far portion 102*b* toward the near side. The visor hood 50 is a member attached to the instrument panel 102, and is attached to the instrument panel 102 in the vehicle interior 101. The visor hood 50 is cantilevered by the far portion 102*b* and may be referred to as an eaves member. The visor hood forms the interior of the vehicle interior 101.

The hood cover 60 is fixed to the visor hood 50 while covering the recessed opening 56. The hood cover 60 has translucency and is formed of, for example, a resin material or a glass material. The hood cover 60 is formed in a plate shape and has a pair of plate surfaces. In the hood cover 60, one plate surface is the cover front surface 61, and the other plate surface is the cover back surface 62. The cover front surface 61 and the cover back surface 62 both extend along the display surface 22. The cover front surface 61 faces the side opposite to the display surface 22. The cover back surface 62 faces the display surface 22 side and opposes the display surface 22. The hood cover 60 is disposed at a position spaced apart from the display surface 22 toward the near side. The image light emitted from display surface 22 is transmitted through hood cover 60 and applied to the reflecting mirror 15.

The heat dissipating part 40 dissipates heat of the display 20 to the outside of the visor hood 50. The heat dissipating part 40 includes a heat dissipation plate portion 41 and a heat dissipation fin 44. Each of the heat dissipation plate portion 41 and the heat dissipation fin 44 is formed of a metal material or the like, and has thermal conductivity.

The heat dissipation plate portion 41 extends along the display back surface 24 and is provided between the display back surface 24 and the heat insulating part 30. The heat dissipation plate portion 41 is a heat transfer material and forms a heat transfer layer. The heat dissipation plate portion 41 has a heat dissipation front surface 42 and a heat dissipation back surface 43. The heat dissipation plate portion 41 is formed in a plate shape and has a pair of plate surfaces. In the heat dissipation plate portion 41, one plate surface is a heat dissipation front surface 42, and the other plate surface is a heat dissipation back surface 43. The heat dissipation front surface 42 is superimposed on the display back surface 24, and the heat dissipation back surface 43 opposes the recessed bottom surface 54. Since the heat dissipation front surface 42 and the display back surface 24 are joined by an adhesive or the like, the heat dissipation plate portion 41 and the display 20 are fixed to each other.

The heat dissipation fin 44 is thermally connected to the heat dissipation plate portion 41. The heat dissipation fin 44 extends from the heat dissipation plate portion 41 toward the outside of the visor hood 50 and corresponds to a heat dissipation extending portion. The heat dissipation fin 44 has a plurality of fin portions and a connecting portion that connects these fin portions. The heat dissipation fin 44 is exposed to the outside of the visor hood 50. The heat dissipation fin 44 extends from the heat dissipation plate portion 41 toward the hood front surface 51 in the device thickness direction. The heat dissipation fin 44 is provided at a position spaced apart from the hood recess 53 toward the hood basal end portion 58 side. The heat dissipation fin 44 is located at a position spaced apart from the display 20 to both the hood basal end portion 58 side and the hood back surface 52 side. The heat dissipation fin 44 is covered from above by at least one of the visor hood 50 and the instrument panel 102. In the vehicle interior 101, the irradiation of sunlight to the heat dissipation fin 44 is blocked by at least one of the visor hood 50 and the instrument panel 102.

The heat dissipation fin 44 is detachably connected to the heat dissipation plate portion 41. The heat dissipation fin 44 is fixed to the heat dissipation plate portion 41 by a fixing tool such as a screw, for example. For example, the connecting portion of the heat dissipation fin 44 and the heat dissipation plate portion 41 are connected inside the hood recess 53. In the heat dissipating part 40, the heat dissipation plate portion 41, the heat dissipation fin 44, and the connecting tool form a heat transfer path. When the display 20 generates heat with the driving of the display 20, the heat is released from the heat dissipation fin 44 to the lower side of the instrument panel 102 via the heat dissipation plate portion 41. The heat transfer path of the heat dissipating part 40 is a heat dissipation path that dissipates heat of the display 20 to the outside of the visor hood 50.

The heat insulating part 30 regulates transfer of heat of the visor hood 50 from the recessed bottom surface 54 to the display 20. The heat insulating part 30 may be referred to as a heat transfer regulating unit. Heat applied to the visor hood includes solar heat. For example, when the hood back surface 52 is irradiated with sunlight, solar heat by the sunlight is applied to the visor hood 50. Sunlight is a type of external light that is transmitted through the windshield and is applied to the hood back surface 52. When heat applied to the visor hood 50 by irradiating the hood back surface 52 with external light is referred to as external light heat, sunlight is a type of external light heat.

In the image display device 10, there are two heat paths of different systems. One of the two heat paths is a heat insulation path through which the heat insulating part 30 blocks solar heat, and the other path is a discharge path through which the heat dissipating part 40 dissipates heat of the display 20. The heat insulation path is on the hood back surface 52 side in the image display device 10, and the heat dissipation path is on the hood front surface 51 side. The heat insulation path and the heat dissipation path are on opposite sides to each other in the device thickness direction.

The heat insulating part 30 is a heat insulating material formed of a resin material, a fiber material, or the like, and has heat insulating properties. The thermal conductivity of the heat insulating part 30 is, for example, substantially equal to or lower than the thermal conductivity of air. Examples of the heat insulating material include a combination of a resin expanded foam or a nonwoven fabric and a high-performance heat insulating member such as silica aerogel, and a flexible vacuum heat insulating member. The heat insulating part 30 forms a heat insulating layer. For example, the heat insulating property of the heat insulating part 30 is higher than the heat insulating property of the visor hood 50. The thermal conductivity of the heat insulating part 30 is less likely to change even when the temperature of the heat insulating part 30 changes. On the other hand, the thermal conductivity of the air tends to easily change when the temperature of the air changes. For this reason, unlike the present embodiment, for example, there is a concern that the heat insulating performance of the heat insulating layer changes with a temperature change of the heat insulating layer in a configuration in which the heat insulating layer is formed of air.

The heat insulating part 30 is an elastic member having elasticity and stretchability, and is elastically deformable. The heat insulating part 30 is elastically deformed or flexibly stretch deformed with application of an external force to the heat insulating part 30. The heat insulating part 30 stretch deforms in accordance with a temperature change of the heat insulating part 30. For example, the heat insulating part 30 extends with temperature rise contracts with temperature drop. Furthermore, the flexibility of the heat insulating part 30 may change according to a temperature change of the heat insulating part 30. For example, the heat insulating part 30 may have higher flexibility as the temperature rises, and may have lower flexibility as the temperature drops. The heat insulating part 30 is more likely to linearly expand or deform by an external force than the visor hood 50 and the heat dissipation plate portion 41. That is, the heat insulating part 30 has a larger linear expansion coefficient or a lower tensile strength or Young's modulus than those of the visor hood 50 and the heat dissipation plate portion 41.

The heat insulating part 30 extends along the recessed bottom surface 54 and is provided between the recessed bottom surface 54 and the heat dissipation plate portion 41. The heat insulating part 30 is formed in a plate shape and has a pair of plate surfaces. In heat insulating part 30, one plate surface is the heat insulating front surface 31, and the other plate surface is the heat insulating back surface 32. The heat insulating front surface 31 is superimposed on the heat dissipation back surface 43, and is joined to the heat dissipation back surface 43 with an adhesive or the like. The heat insulating front surface 31 opposes the display back surface 24. The heat insulating back surface 32 is superimposed on the recessed bottom surface 54, and is joined to the recessed bottom surface 54 with an adhesive or the like. The heat insulating part 30 is fixed to both the heat dissipation plate portion 41 and the visor hood 50.

The display 20 is fixed to the recessed bottom surface 54 via the heat dissipation plate portion 41 and the heat insulating part 30. The elastically deformable heat insulating part 30 is elastically deformed in accordance with a relative displacement of the display 20 and the heat dissipation plate portion 41 with respect to the visor hood 50. For example, when vibration associated with traveling of the vehicle 100 is applied to the image display device 10, an increase in vibration of the display 20 due to relative displacement of the display 20 with respect to the visor hood 50 is suppressed by the elastic deformation of the heat insulating part 30. Similarly, an increase in vibration of the heat dissipation plate portion 41 and the display 20 due to relative displacement of the heat dissipation plate portion 41 with respect to the visor hood 50 is suppressed by the elastic deformation of the heat insulating part 30. The relative displacement of the display 20 and the heat dissipation plate portion 41 with respect to the visor hood 50 includes deformation of at least one of the visor hood 50, the display 20, and the heat dissipation plate portion 41.

In addition, the vibration of the display 20 is also suppressed by damping of vibration and back surface support by preloading. For example, unlike the present embodiment, in a configuration in which the air layer is provided on the back surface side of the display 20 instead of the heat insulating part 30, there is a concern that an additional effect for suppressing vibration cannot be obtained and the display 20 easily vibrates.

Figure 3:
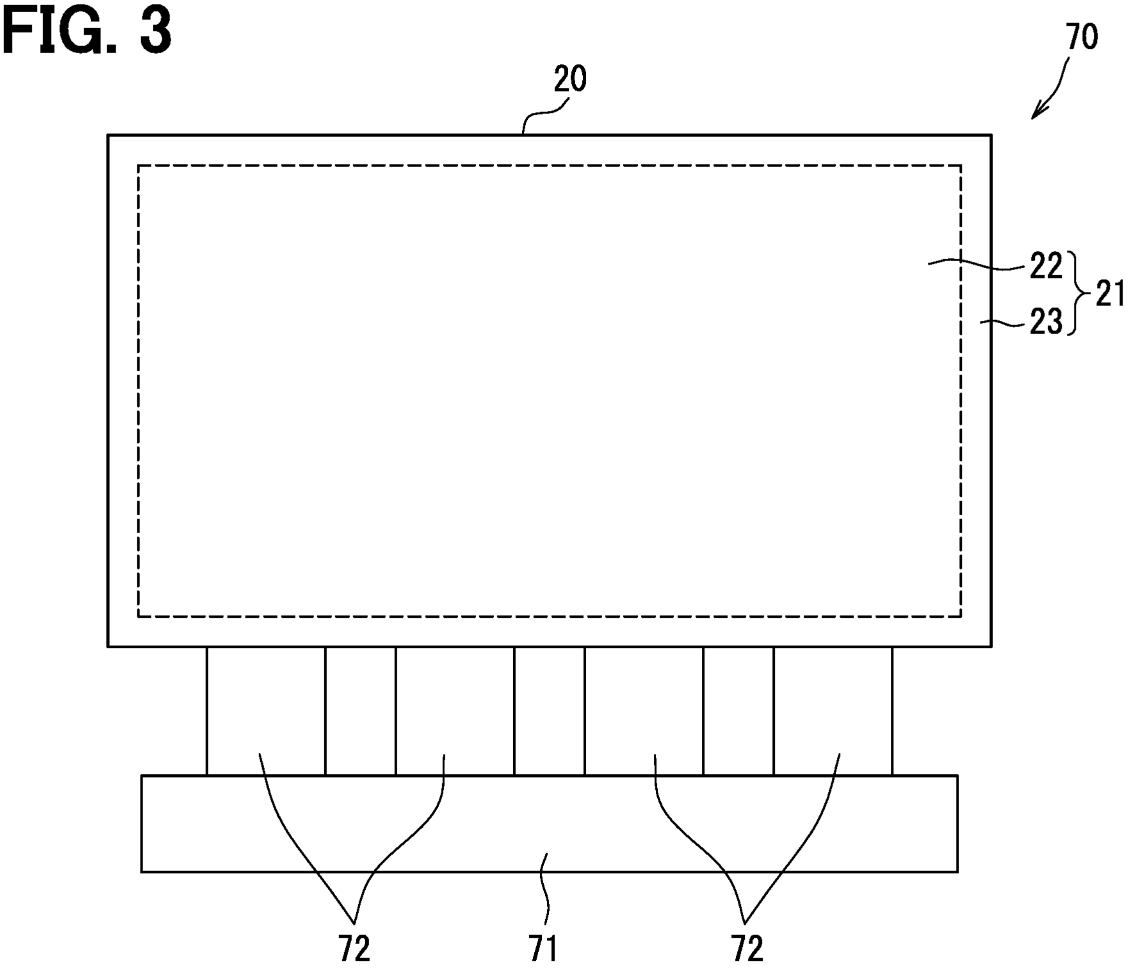
FIG. 3 is a diagram illustrating a configuration of a display unit.

As illustrated in FIG. 3, the display 20 is included in the display unit 70. The display unit 70 is included in the image display device 10. The display unit 70 includes a circuit board 71 and a connection cable 72 in addition to the display 20. The circuit board 71 controls the display 20 by controlling the light emitting element and the like. The circuit board 71 is mounted with electronic components and constitutes, for example, a driver circuit. The connection cable 72 electrically connects the circuit board 71 and the display 20, and inputs a signal from the circuit board 71 to the display 20. The connection cable 72 is a band-shaped cable having flexibility, and is, for example, a flexible flat cable. A plurality of connection cables 72 are arranged side by side along the outer surface of the display 20.

The display unit 70 is accommodated in the visor hood 50. That is, the visor hood 50 accommodates the circuit board 71 and the connection cable 72 in addition to the display 20. In the visor hood 50, the circuit board 71 is provided at a position spaced apart from the display 20 toward the hood basal end portion 58 side. In the display unit 70, irradiation of the circuit board 71 and the connection cable 72 with sunlight is blocked by at least one of the visor hood 50 and the instrument panel 102. Note that the circuit board 71 and the connection cable 72 may not be accommodated in the visor hood 50 as long as the circuit board 71 and the connection cable 72 are blocked from being irradiated with sunlight.

Figure 4:
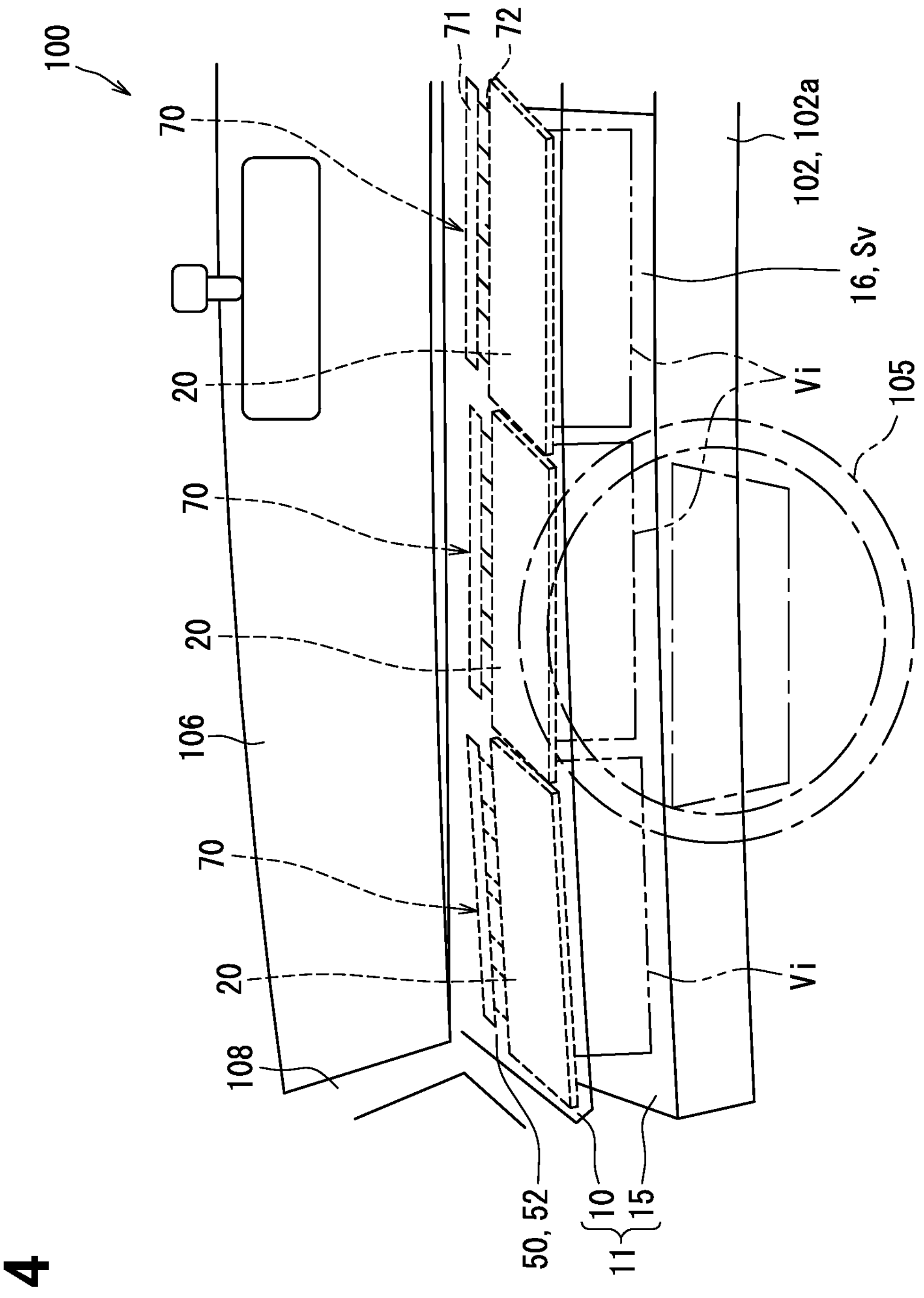
FIG. 4 is a diagram illustrating a configuration of a periphery of the virtual image display device in a vehicle interior.

As illustrated in FIG. 4, in the vehicle 100, a pair of A-pillars 108 are arranged side by side in the vehicle width direction. The A-pillars 108 are arranged side by side on the front windshield 106 in the vehicle width direction. The A-pillar 108 corresponds to a pillar and may be referred to as a front pillar. The front windshield 106 is bridged across the pair of A-pillars 108 in the vehicle width direction. The vehicle width direction is a width direction for the vehicle 100, and is a direction orthogonal to the vehicle front-rear direction.

The virtual image display device 11 extends in the vehicle width direction. The virtual image display device 11 is installed in the vehicle 100 such that the device width direction becomes the vehicle width direction. The device width direction is the width direction of the image display device 10. In the virtual image display device 11, both the image display device 10 and the reflecting mirror 15 extend in the vehicle width direction. The image display device 10 and the reflecting mirror 15 extend in the vehicle width direction at least at a position in front of the driver's seat. In the image display device 10, the visor hood 50 and the hood cover 60 extend in the vehicle width direction. For example, the visor hood 50, the hood cover 60, and the reflecting mirror are all bridged across both side ends of the instrument panel 102 in the vehicle width direction. In this case, the visor hood 50, the hood cover 60, and the reflecting mirror 15 are all bridged across the pair of A-pillars 108. A plurality of display units 70 are arranged side by side in the vehicle width direction. In the plurality of display units a plurality of displays 20 and a plurality of circuit boards 71 are arranged side by side in the vehicle width direction along the recessed bottom surface 54.

In the virtual image display device 11, a plurality of display surfaces 22 are arranged side by side in the vehicle width direction. The virtual images Vi displayed on the respective display surfaces 22 are arranged side by side in the vehicle width direction on the reflecting mirror 15. For example, the plurality of virtual images Vi are in a state of being arranged side by side so as to be bridged across both side ends of the instrument panel 102 in the vehicle width direction.

Figure 5:
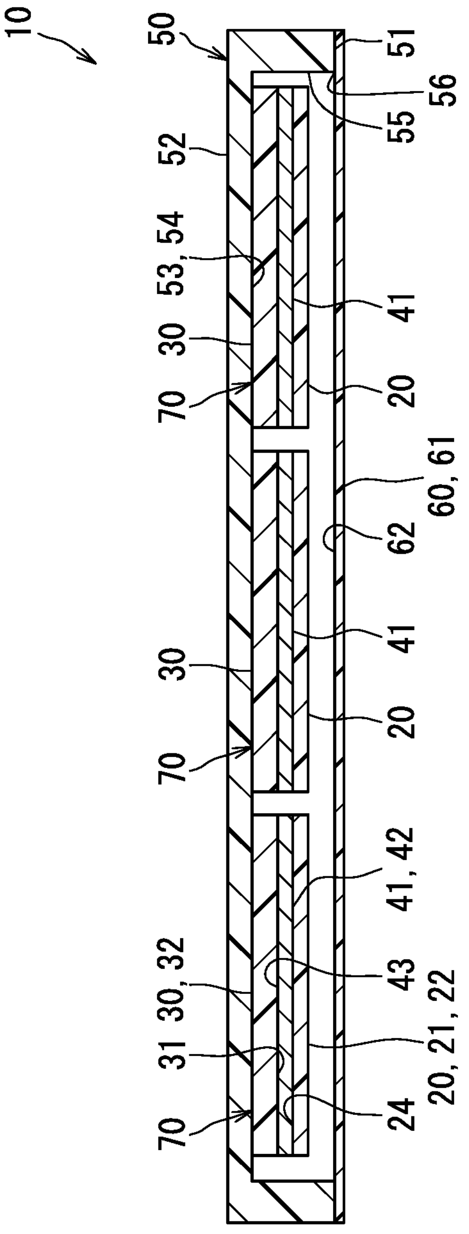
FIG. 5 is a diagram illustrating a transverse cross-sectional view of the image display device, and corresponds to a cross-sectional view taken along line V-V of FIG. 2.

As illustrated in FIG. 5, the display unit 70 includes the heat insulating part and the heat dissipating part 40. In the display unit 70, ends of the display 20, the heat insulating part 30, and the heat dissipation plate portion 41 in the vehicle width direction are arranged side by side in the device thickness direction. In the image display device 10, a plurality of displays 20, heat insulating parts 30, and heat dissipation plate portions 41 are respectively arranged side by side in the vehicle width direction along the recessed bottom surface 54. The plurality of display units 70 are individually fixed to the recessed bottom surface 54. Therefore, each of the plurality of display units 70 can be individually attached to and detached from the visor hood 50. In the plurality of displays 20, the respective plurality of display front surfaces 21 are arranged side by side in the device width direction. All of the plurality of display front surfaces 21 face the reflection surface 16. In the display front surface 21, both the display surface 22 and the frame surface 23 face the reflection surface 16. In the plurality of display front surfaces 21, the respective frame surfaces 23 have the same color or a similar color with each other. All the colors of the frame surfaces 23 are, for example, black, and the saturation and brightness are the same. Note that, for the plurality of frame surfaces 23, at least one of hue, saturation, and brightness may be different, but the difference is preferably as small as possible.

In the virtual image display device 11, while a plurality of display surfaces 22 and a plurality of frame surfaces 23 are provided, one reflection surface 16 and one cover front surface 61 are provided. In the virtual image display device 11, a plurality of virtual images Vi generated by a plurality of images V are collectively displayed on one reflection surface 16. As described above, in the reflection surface 16, the virtual image Vi reflecting the image V stands out more than the virtual image V23 reflecting the frame surface 23. Therefore, the occupant can easily visually recognize the plurality of virtual images Vi in an integrated state rather than a state of being partitioned by the frame surface 23.

The plurality of displays 20 are provided at positions that do not block the image light emitted from the respective displays. In the two adjacent displays 20, one display 20 is provided at a position that does not block the image light emitted from the other display 20.

In the plurality of display units 70, the thickness dimensions of each of the display 20, the heat insulating part 30, and the heat dissipation plate portion 41 are uniform and are substantially the same. In the plurality of display units 70, the respective display surface 22, heat insulating front surface 31, and heat dissipation front surface 42 are arranged side by side in the vehicle width direction. In the plurality of display units 70, the separation distances between the display surface 22 and the reflecting mirror 15 are the same, and are substantially the same.

Two adjacent display units 70 are spaced apart from each other. In the two adjacent display units 70, the respective display 20, the heat insulating part 30, and the heat dissipation plate portion 41 are spaced apart from each other. In the two adjacent display units 70, a gap between the displays 20, a gap between the heat insulating parts 30, and a gap between the heat dissipation plate portions 41 are arranged side by side in the device thickness direction. The display 20, the heat insulating part 30, and the heat dissipation plate portion 41 each have a pair of side end portions are arranged side by side in the device width direction. In one display unit 70, side end portions of the display 20, the heat insulating part 30, and the heat dissipation plate portion 41 are arranged side by side in the device thickness direction.

<Configuration Group A>

According to the present embodiment described above, in the image display device 10, the heat insulating part 30 is provided between the display back surface 24 and the recessed bottom surface 54. In this configuration, even if the hood back surface 52 is irradiated with sunlight serving as external light, solar heat serving as external light heat can be suppressed from being transmitted from the visor hood to the display 20 by the heat insulating part 30. Therefore, the heat insulating part can suppress occurrence of abnormality in the display 20 due to an excessive rise in the temperature of the display 20 caused by solar heat.

For example, unlike the present embodiment, in a configuration in which the heat insulating part 30 is not provided between the display back surface 24 and the recessed bottom surface 54, there is a concern that the temperature of the instrument panel 102 or the visor hood 50 may become excessively high when the top surface of the instrument panel 102 or the hood back surface 52 is directly irradiated with solar radiation. For example, the temperatures of the instrument panel 102 and the visor hood 50 may exceed 100° C. As described above, when the temperature of the visor hood 50 becomes excessively high, the display 20 and the circuit board 71 in the visor hood 50 may be deteriorated or damaged by heat. In particular, when the temperature of the organic EL display rises to above 90° C. and close to 100° C., it is conceivable that deterioration or damage of the organic EL display accelerates.

Therefore, a method of air-cooling the visor hood 50 with an electric fan or the like is considered. However, in this method, when a power switch such as an ignition switch is turned off, it is difficult to perform air-cooling of the visor hood 50 by the electric fan. In addition, as a measure to alleviate the solar radiation heat transmitted from the visor hood 50 to the display 20, a method of providing an air layer of about 5 to 15 mm between the visor hood 50 and the display 20 is considered. According to this method, solar radiation heat is less likely to be directly transferred from the visor hood 50 to the display 20. However, in this method, it is conceivable that the visor hood 50 becomes thicker by the air layer, and the neat appearance design of the image display device 10 is impaired.

On the other hand, according to the present embodiment, solar radiation heat transferred from the recessed bottom surface 54 to the display back surface 24 is alleviated by the heat insulating part 30. Therefore, even when the power switch of the vehicle 100 is turned off, the temperature of the display 20 can be suppressed from becoming excessively high. In addition, the visor hood 50 becomes thinner, and the image display device 10 can be made thinner by making the heat insulating part 30 thinner than the air layer. For this reason, it is possible to independently dispose the thin image display device 10 having a thickness of 10 to 20 mm, for example, for the increasing needs for a thin design for a notebook computer, a smartphone, an in-vehicle display, and the like.

In particular, in a state where the image display device 10 is mounted on the vehicle 100, the visor hood 50 is attached to the instrument panel 102. In the vehicle 100, when the visor hood 50 is irradiated with sunlight that has transmitted through the windshield, the temperature of the visor hood 50 tends to become excessively high. Therefore, the configuration in which the heat insulating part 30 regulates the transmission of heat of the visor hood 50 to the display 20 is effective for the image display device 10 mounted in the vehicle 100 from the viewpoint of protecting the display 20 from heat.

Moreover, the heat insulating part 30 is elastically deformed in accordance with the relative displacement of the display 20 with respect to the visor hood 50, and the display 20 is fixed to the recessed bottom surface 54 through the heat insulating part 30. In this configuration, even if vibration is applied to the visor hood 50, the elastic deformation of the heat insulating part 30 can prevent the vibration from being transmitted from the visor hood 50 to the display 20. In addition, transmission of vibration from the visor hood 50 to the display 20 can also be suppressed by elastic deformation of the heat insulating part 30, damping of vibration, and back surface support by preloading. Therefore, the elastic deformation of the heat insulating part 30 can prevent an abnormality from occurring in the display 20 due to the vibration of the visor hood 50. In addition, the elastic deformation of the heat insulating part 30 can prevent display 20 from vibrating due to vibration of the vehicle 100.

As described above, according to the present embodiment, the occurrence of abnormality in the display 20 can be suppressed from both the viewpoint of heat and the viewpoint of vibration.

Figure 6:
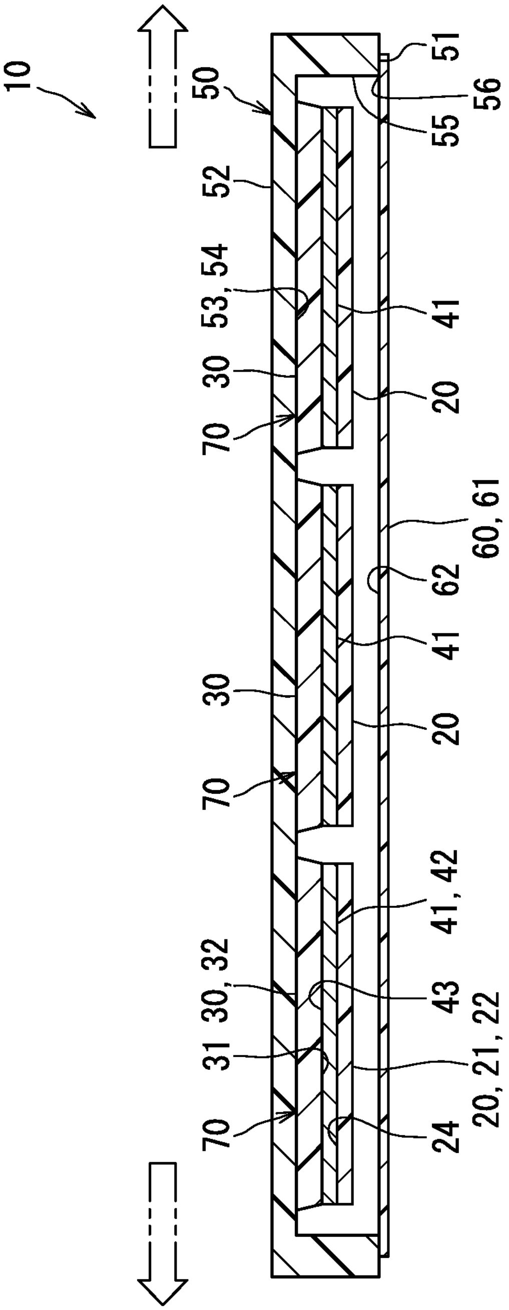
FIG. 6 is a diagram illustrating a transverse cross-sectional view of the image display device in a state in which a visor hood is linearly expanded.

According to the present embodiment, a plurality of heat insulating parts 30 are arranged side by side along the recessed bottom surface 54. In this configuration, for example, as illustrated in FIG. 6, when the visor hood 50 is linearly expanded by solar heat, each of the plurality of heat insulating parts 30 individually deforms. Therefore, even if the recessed bottom surface 54 extends in the width direction with the linear expansion of the visor hood 50, the extension of the recessed bottom surface 54 is individually absorbed by the plurality of heat insulating parts 30. Therefore, the plurality of heat insulating parts 30 can prevent the stress generated by the linear expansion of the visor hood 50 from being applied to the display 20. In addition, since the plurality of heat insulating parts 30 are joined to the recessed bottom surface 54, a joint area of one heat insulating part 30 and the recessed bottom surface 54 can be made as small as possible. Therefore, the joint between the visor hood 50 and the heat insulating part 30 can be suppressed from peeling due to a difference in linear expansion between the visor hood 50 and the heat insulating part 30.

Note that a case where the visor hood 50 is deformed includes a case where an external force is applied to the visor hood 50 by an occupant or the like, a case where shaking caused by traveling of the vehicle 100 is large, and the like, in addition to a case where the visor hood 50 is linearly expanded.

According to the present embodiment, the heat insulating part 30 is individually provided for each of the plurality of displays 20. In this configuration, the heat insulating part 30 provided in each of the plurality of displays 20 is individually deformed with the linear expansion of the visor hood 50. Therefore, the extension of the recessed bottom surface 54 is individually absorbed by the heat insulating part 30 for each display 20. Therefore, the occurrence of deformation such as deflection in the display 20 can be individually suppressed for each of the plurality of displays 20. In addition, stress and load generated by the linear expansion of the visor hood 50 can be distributed to the plurality of displays 20 through the plurality of heat insulating parts 30. Furthermore, peeling of the joint between the heat dissipation plate portion 41 and the heat insulating part 30 and peeling of the joint between the display 20 and the heat dissipation plate portion 41 can be suppressed.

Moreover, the heat insulating parts 30 individually provided for each display are spaced apart from each other. In this configuration, when the visor hood 50 is linearly expanded, it is possible to prevent the heat insulating parts 30 provided for the two adjacent displays 20 from coming into contact with each other and preventing the heat insulating parts 30 from being deformed to extend. Therefore, an abnormality such as deformation can be more reliably suppressed from occurring in the display 20 with the linear expansion of the visor hood 50.

According to the present embodiment, the heat dissipation fin 44 is at a position spaced apart from the display 20. With this configuration, heat transferred from the display 20 to the heat dissipation fin 44 via the heat dissipation plate portion 41 can be suppressed from returning back to the display 20 again. For this reason, the heat dissipation of the display 20 can be reliably performed by the heat dissipation fins 44 and the heat dissipation plate portions 41.

According to the present embodiment, the heat dissipation plate portion 41 is individually provided in each of the plurality of heat insulating parts 30. In this configuration, when the plurality of heat insulating parts 30 are individually deformed due to the linear expansion of the visor hood 50, displacement or deformation of the heat dissipation plate portion 41 may individually occur for each heat insulating part 30. Therefore, the joint between the heat insulating part 30 and the heat dissipation plate portion 41 can be suppressed from peeling. In addition, it is possible to suppress stress generated by linear expansion of the visor hood 50 from being intensively applied to one heat dissipation plate portion 41 through the heat insulating part 30. That is, the stress generated by the linear expansion of the visor hood 50 can be dispersed into the plurality of heat dissipation plate portions 41. As a result, deformation and breakage of the heat dissipation plate portion 41 can be suppressed.

According to the present embodiment, both the heat insulating part 30 and the heat dissipation plate portion 41 are individually provided in each of the plurality of displays 20. In this configuration, when the heat insulating part 30 is deformed for each display 20 with the linear expansion of the visor hood 50, the heat dissipation plate portion 41 is deformed or displaced for each display 20 in accordance with the deformation of the heat insulating part 30. Therefore, peeling of the joint between the heat insulating part 30 and the heat dissipation plate portion 41 and peeling of the joint between the heat dissipation plate portion 41 and the display 20 can be suppressed.

Moreover, the heat dissipation plate portions 41 provided for each display are spaced apart from each other. In this configuration, when the heat insulating part 30 is deformed for each display 20 with the linear expansion of the visor hood 50, it is possible to suppress the heat dissipation plate portions 41 provided for the adjacent displays 20 from coming into contact with each other and the heat dissipation plate portion 41 from inhibiting the deformation of the heat insulating part 30. Therefore, an abnormality such as deformation can be more reliably suppressed from occurring in the display 20 due to failure of the heat insulating part 30 to absorb the linear expansion of the visor hood 50.

Figure 8:
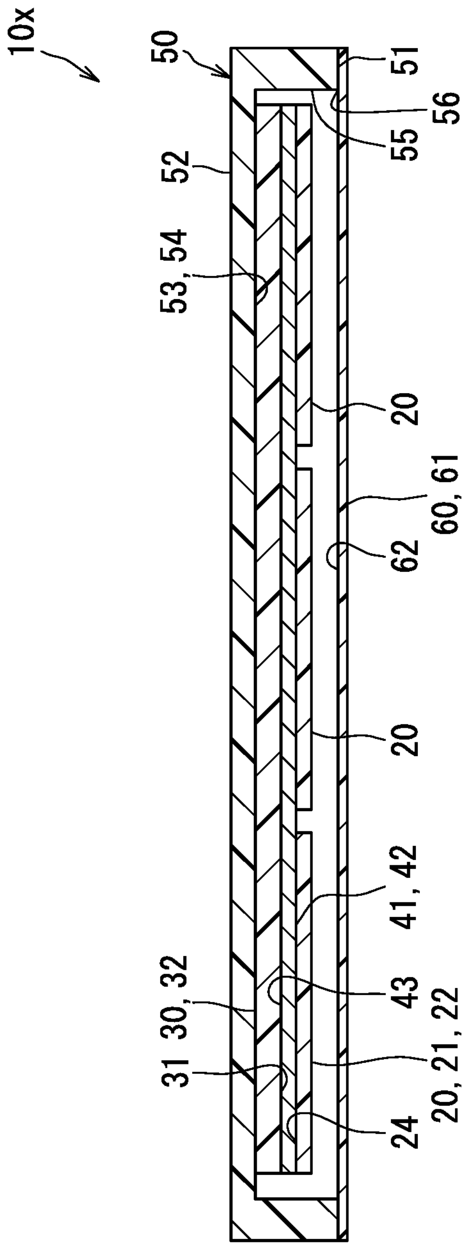
FIG. 8 is a diagram illustrating a transverse sectional view of a comparative example.

For the image display device 10, for example, a comparative example 10*x* different from the present embodiment is assumed. As illustrated in FIG. 8, in comparative example 10*x*, each of the heat insulating part 30 and the heat dissipation plate portion 41 is provided so as to be bridged across the plurality of displays 20. In comparative example 10*x*, the heat insulating part 30 and the heat dissipation plate portion 41 provided for the plurality of displays 20 are each formed as one continuous body in an integrated shape.

Figure 9:
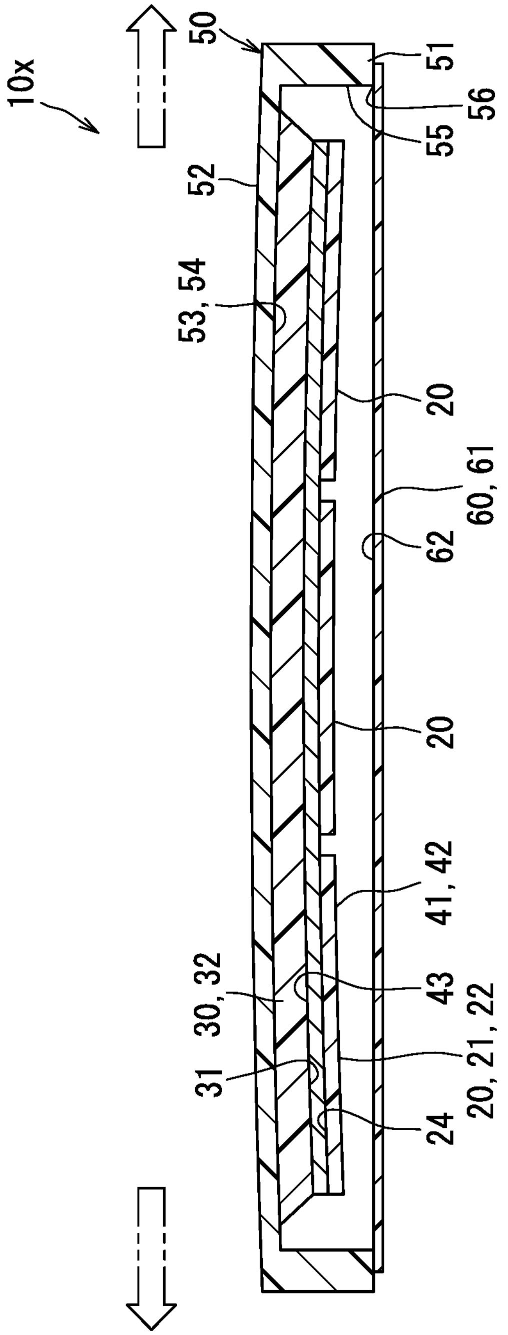
FIG. 9 is a diagram illustrating a transverse cross-sectional view of the comparative example in a state in which a visor hood is linearly expanded.

As illustrated in FIG. 9, when the visor hood 50 is linearly expanded in comparative example 10*x*, the heat insulating part 30 is deformed so as to be pulled by the visor hood 50. Furthermore, when the deformation of the heat insulating part 30 cannot fully absorb the linear expansion of the visor hood 50, the heat dissipation plate portion 41 deforms together with the heat insulating part 30. If the visor hood 50, the heat insulating part 30, and the heat dissipation plate portion 41 have different linear expansions, there is a concern that stress generated by the linear expansion of the visor hood 50 is added up by the difference in linear expansions and applied to the display 20, which may cause an abnormality in the display 20. In addition, there is a concern that this stress is applied to a joint portion between the visor hood 50 and the heat insulating part 30, a joint portion between the heat dissipation plate portion 41 and the heat insulating part 30, and a joint portion between the display 20 and the heat dissipation plate portion 41, and peeling occurs at these joint portions.

According to the present embodiment, a plurality of displays 20 and a plurality of heat dissipation plate portions 41 are arranged side by side along the recessed bottom surface 54. In this configuration, for example, when attaching and detaching one display 20 to and from the visor hood 50, only the heat dissipation plate portion 41 corresponding to the display 20 can be attached to and detached from the visor hood 50. As described above, since the display 20 and the heat dissipation plate portion 41 can be individually attached and detached, work load and cost can be reduced.

Figure 7:
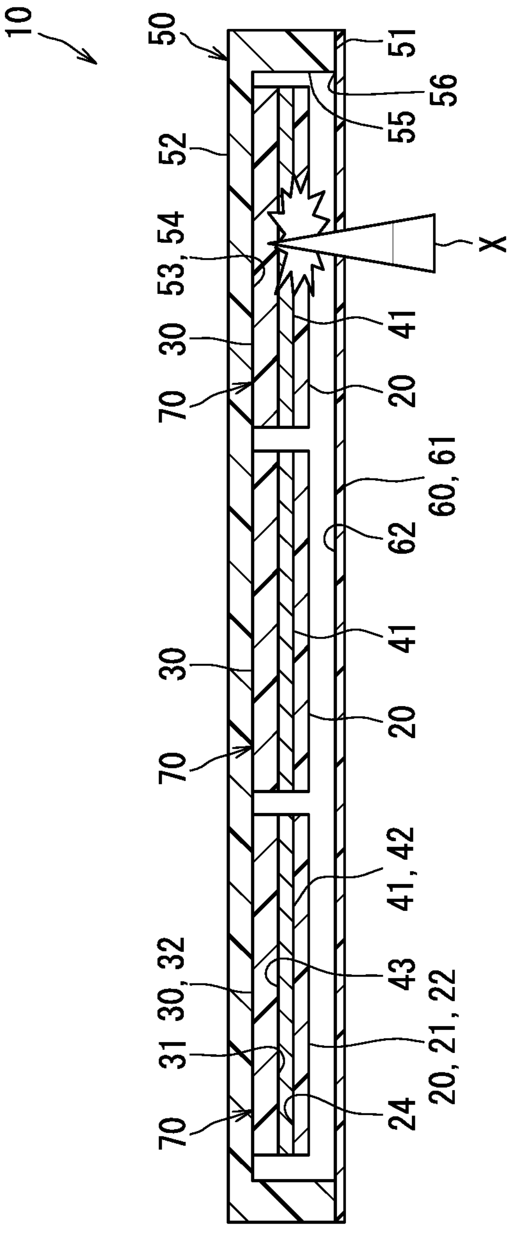
FIG. 7 is a diagram illustrating a transverse cross-sectional view of the image display device in a state in which an object is in contact with a visor hood.

Note that, a case where the display 20 is attached and detached includes a case where the display 20 is replaced. For example, in a case where an abnormality occurs in the display 20 due to contact of an object X with the display 20 as illustrated in FIG. 7, the display 20 is replaced. When performing attachment/detachment work or replacement work of the display 20 or the like, the worker first removes the hood cover 60 from the visor hood 50. Then, attachment/detachment and replacement of the display 20 or the like are performed through the recessed opening 56.

Moreover, since the heat dissipation plate portion 41 is individually provided for each display 20, attachment and detachment of the heat dissipation plate portion 41 together with the display 20 can be facilitated. For example, instead of attaching and detaching the display 20 to and from the visor hood 50 and attaching/detaching the heat dissipation plate portion 41 in order, the display 20 and the heat dissipation plate portion 41 can be collectively attached/detached. Therefore, a work load when attaching and detaching the display 20 and the heat dissipation plate portion 41 can be reduced.

Moreover, the heat dissipation plate portions 41 provided for each display 20 are spaced apart from each other. For this reason, when the worker attaches and detaches one heat dissipation plate portion 41, the adjacent heat dissipation plate portion 41 is unlikely to become an obstacle. For example, a work in which a worker inserts a hand or a tool into a gap between two adjacent heat dissipation plate portions 41 and removes one of the heat dissipation plate portions 41 can be facilitated. Therefore, work efficiency at the time of attaching and detaching the display 20 and the heat dissipation plate portion 41 can be enhanced.

According to the present embodiment, a plurality of displays 20 and a plurality of heat insulating parts 30 are arranged side by side along the recessed bottom surface 54. In this configuration, for example, when replacing one display 20, only the heat insulating part 30 corresponding to the display 20 can be replaced. As described above, since the display 20 and the heat insulating part 30 can be individually replaced, work load and cost can be reduced.

In addition, since the heat insulating part 30 is individually provided for each display 20, attachment and detachment of the heat insulating part 30 together with the display 20 can be facilitated. For example, instead of attaching and detaching the display 20 and attaching and detaching the heat insulating part 30 in order, the display and the heat insulating part 30 can be collectively attached and detached. Therefore, a work load when attaching and detaching the display 20 and the heat insulating part 30 can be reduced.

Moreover, the heat insulating parts 30 individually provided for each display are spaced apart from each other. For this reason, when the worker attaches and detaches one heat insulating part 30, the adjacent heat insulating part 30 is unlikely to become an obstacle. For example, a work in which a worker inserts a hand or a tool into a gap between two adjacent heat insulating parts 30 and removes one of the heat insulating parts 30 can be facilitated. Therefore, work efficiency at the time of attaching and detaching the display 20 and the heat insulating part 30 can be enhanced.

According to the present embodiment, two adjacent displays 20 are spaced apart from each other. For this reason, when the worker attaches and detaches one display 20, the adjacent display 20 is unlikely to become an obstacle. For example, a work in which a worker inserts a hand or a tool into a gap between two adjacent displays 20 and removes one of the displays 20 can be facilitated. Therefore, work efficiency at the time of attaching and detaching the display 20 can be enhanced.

Figure 10:
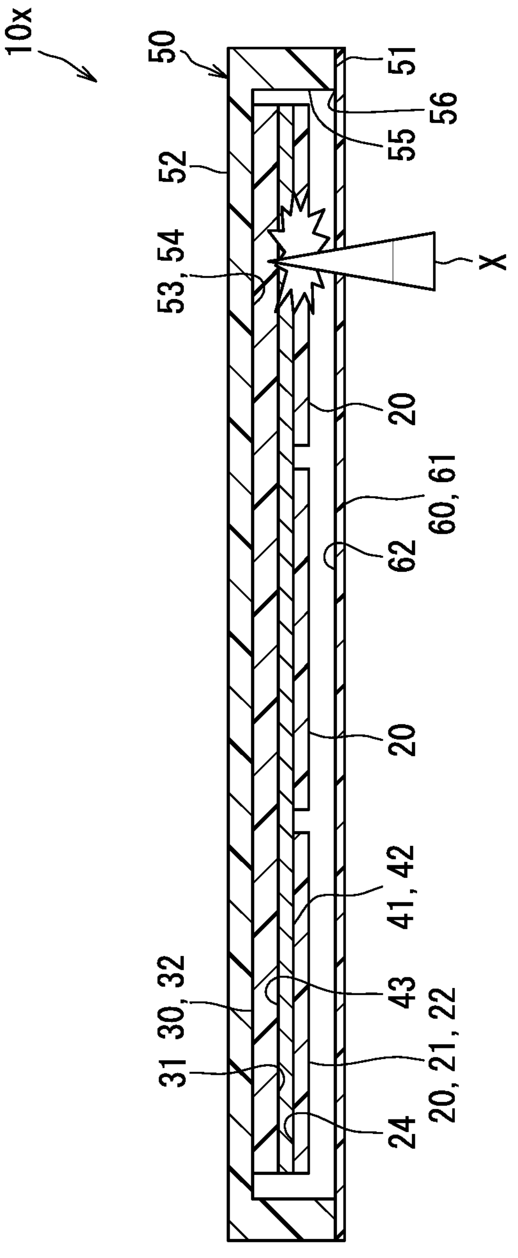
FIG. 10 is a diagram illustrating a transverse cross-sectional view of the comparative example in a state in which an object is in contact with a visor hood.

In comparative example 10*x*, as illustrated in FIG. 10, a case where the heat dissipation plate portion 41 and the heat insulating part 30 are replaced together with one display 20 by contact of an object X or the like is assumed. In comparative example 10*x*, all the displays 20 need to be removed in order to remove the heat dissipation plate portion 41 and the heat insulating part 30. In this case, although only one display 20 is to be replaced, a plurality of displays 20 need to be attached and detached. Therefore, the work load when replacing the heat dissipation plate portion 41 and the heat insulating part 30 increases.

On the other hand, according to the present embodiment, since some of the heat dissipation plate portions 41 and the heat insulating parts 30 can be attached and detached as described above, the work load can be reduced. In addition, not all of the heat dissipation plate portions 41 and the heat insulating parts 30 accommodated in the visor hood 50 needs to be replaced. Therefore, the material cost can be reduced for the heat dissipation plate portion 41 and the heat insulating part 30.

According to the present embodiment, the display 20 is fixed to the heat insulating part 30 through the heat dissipation plate portion 41. In this configuration, even if vibration is applied to the visor hood 50, the vibration can be suppressed from being transmitted from the visor hood 50 to the heat dissipation plate portion 41 by the elastic deformation of the heat insulating part 30. For this reason, even in the configuration in which the heat of the display 20 is dissipated by the heat dissipation plate portion 41, the occurrence of abnormality in the display 20 and the heat dissipation plate portion 41 due to the vibration of the visor hood 50 can be suppressed by the elastic deformation of the heat insulating part 30.

According to the present embodiment, the heat dissipation fin 44 extends from the heat dissipation plate portion 41 toward the outside of the visor hood 50. In this configuration, the heat transferred from the display 20 to the heat dissipation plate portion 41 is easily dissipated from the heat dissipation fin 44 to the outside of the visor hood 50. Therefore, it is possible to prevent the heat of the display 20 from getting trapped inside the visor hood 50 and the temperature of the display 20 from further rising due to the trapped heat.

According to the present embodiment, a plurality of heat dissipation plate portions 41 are arranged side by side along the recessed bottom surface 54. With this configuration, a configuration in which, when heat is applied to a part of the heat dissipation plate portions 41 due to driving of only a part of the display 20 or the like, the heat is less likely to be transmitted to the other heat dissipation plate portion 41 can be achieved. Therefore, diffusion of heat from a part of image display device 10 to a wide range can be suppressed by dividing the heat dissipation plate portions 41 into a plurality of parts. For example, in a case where some of the displays 20 are generating heat excessively, the occurrence of abnormality in other displays 20, to which the heat is transferred via the heat dissipation plate portion 41, can be suppressed.

<Configuration Group B>

According to the present embodiment, in the virtual image display device 11, the plurality of display surfaces 22 are arranged side by side along the reflection surface 16 in a state of facing the reflection surface 16. In this configuration, the image V displayed on each of the plurality of display surfaces 22 is displayed as a plurality of virtual images Vi by the reflection surface 16. Therefore, the occupant can collectively visually recognize the plurality of virtual images Vi in one reflection surface 16. Since the reflection surface 16 is the visual recognition surface Sv for the occupant, the size of the visual recognition surface Sv can be increased in the virtual image display device 11.

Moreover, on the reflection surface 16, the virtual image Vi displayed by the image light stands out more than the virtual image V23 in which the frame surface 23 is merely reflected. Therefore, the virtual image gap region can be alleviated from standing out in one visual recognition surface Sv displaying the plurality of virtual images Vi. The virtual image gap region is a region indicating a gap between adjacent virtual images Vi. Therefore, when the occupant visually recognizes the visual recognition surface Sv, the occupant can be suppressed from feeling uncomfortable in the virtual image gap region. In other words, the seamless feeling can be enhanced for the plurality of virtual images Vi visually recognized by the visual recognition surface Sv.

Furthermore, since the self-luminous display unit is adopted as the display 20, light of the backlight is avoided from leaking from a black portion of the image V or the like. For example, in the display front surface 21, light of the backlight is avoided from leaking at the boundary portion between the outer peripheral edge of the display surface 22 and the inner peripheral edge of the frame surface 23. Thus, in the virtual image gap region, the frame surface 23 can be suppressed from standing out by the light of the backlight. Therefore, the seamless feeling on the visual recognition surface Sv can be enhanced by preventing light leakage from the backlight.

According to the present embodiment, the plurality of displays 20 are arranged side by side in the device width direction. In this configuration, in two adjacent displays 20, the image light emitted from one display 20 can be avoided from being blocked by the other display 20. Therefore, the virtual image gap region can be avoided from standing out due to the image light being blocked.

In the present embodiment, since there is a gap between the two adjacent displays 20, a virtual image reflecting the gap is included in the virtual image gap region in the visual recognition surface Sv. In addition, since the virtual image Vi is displayed by the image light, the virtual image of the gap is less likely to stand out in the virtual image gap region as with the virtual image Vi of the frame surface 23. As a result, even if a gap is secured between two adjacent displays 20 in consideration of prioritizing the ease of attachment and detachment of display 20, it is possible to prevent the occupant from feeling uncomfortable about the virtual image reflecting the gap.

According to the present embodiment, in the plurality of displays 20, the respective frame surfaces 23 have similar colors. In this configuration, the degree at which virtual image V23 of frame surface 23 does not stand out can be equalized for the plurality of displays 20. Therefore, when the plurality of virtual images V23 are displayed on the frame surface 23 by the visual recognition surface Sv, it is possible to suppress only a part of the virtual images V23 from standing out.

According to the present embodiment, the visor hood 50 covering the display back surface 24 is bridged across the plurality of displays 20. Therefore, the visor hood 50 can prevent the plurality of displays 20 from being misaligned. For example, the visor hood 50 can suppress the two adjacent display surfaces 22 from being relatively displaced and the two virtual images Vi displayed by the display surfaces 22 from being misaligned.

According to the present embodiment, in the vehicle 100, the visor hood 50 is bridged across the pair of A-pillars 108. In this configuration, the portion where the visor hood 50 is fixed to the instrument panel 102 can be disposed at a position as close as possible to the A-pillar 108. Therefore, the support strength of the visor hood 50 by the instrument panel 102 can be increased. Furthermore, in this configuration, the visor hood 50 can be made as large as possible in the vehicle width direction in the vehicle interior 101. Therefore, the number of image display devices 10 accommodated in the visor hood 50 can be increased. Moreover, the visual recognition surface Sv that is the reflection surface 16 can be enlarged by enlarging the reflecting mirror 15 in accordance with the number of image display devices 10.

According to the present embodiment, the visor hood 50 is a member attached to the instrument panel 102. Thus, it is possible to suppress the designability of the vehicle interior 101 from deteriorating by the visor hood 50. Therefore, the visor hood 50 can enhance the designability of the vehicle interior 101. In particular, in a configuration in which the visor hood 50 is also enlarged with an increase in the size of the visual recognition surface Sv, the visor hood 50 tends to easily stand out in the vehicle interior 101. Therefore, it is effective to enhance the designability of the vehicle interior 101 by the visor hood 50.

Second Embodiment

In the first embodiment, the reflection surface 16 is disposed as the visual recognition surface Sv so as to be visually recognized by the viewer. On the other hand, in the second embodiment, the cover front surface 61 is disposed so as to be visually recognized by the viewer as the visual recognition surface Sv. Configurations, operations, and effects not specifically described in the second embodiment are the same as those of the first embodiment. In the second embodiment, differences from the first embodiment will be mainly described.

Figure 11:
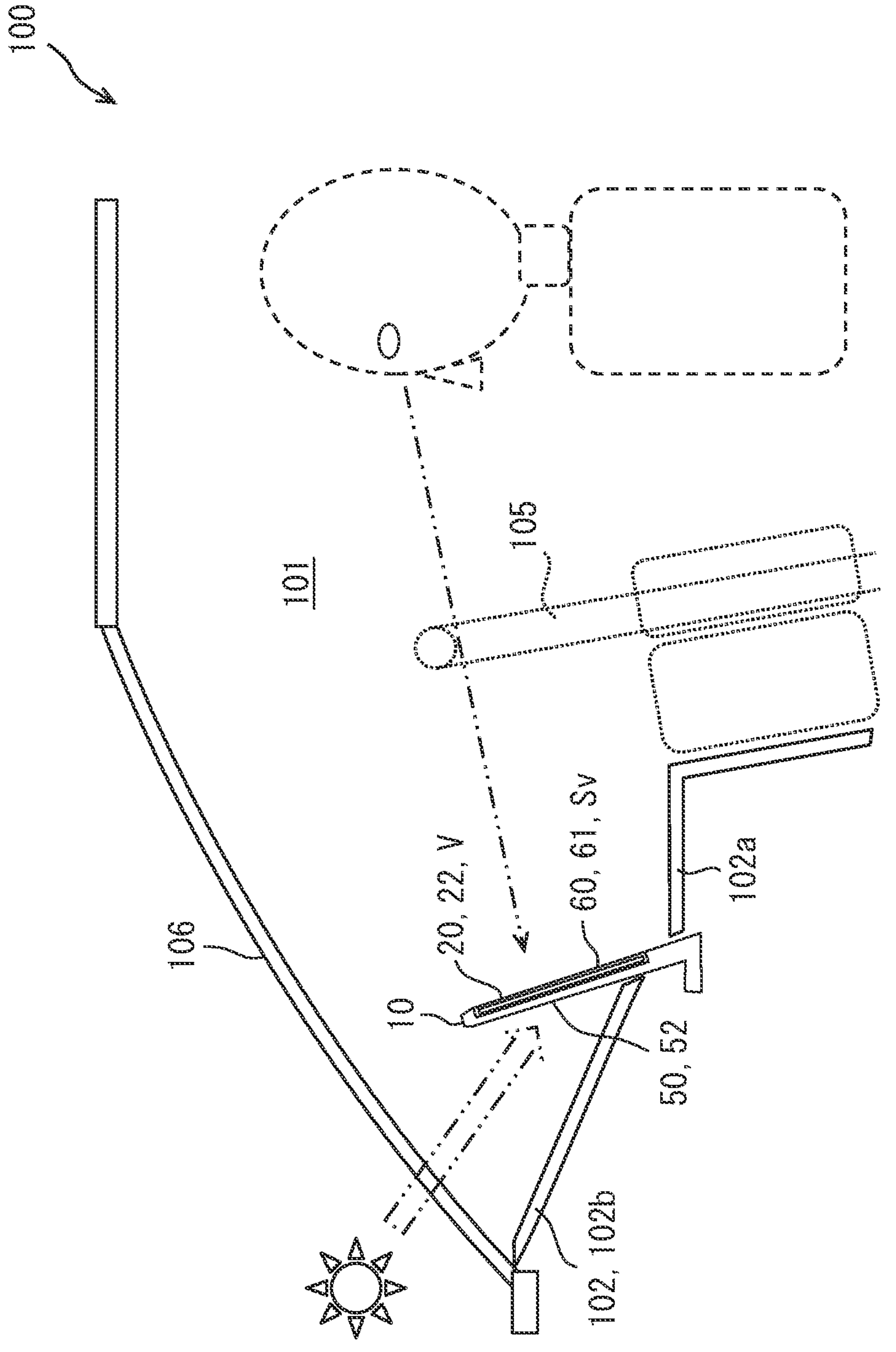
FIG. 11 is a diagram illustrating an image display device in a state of being mounted on a vehicle according to a second embodiment.

In the vehicle 100 illustrated in FIG. 11, the occupant can visually recognize not the virtual image Vi but the image V on the visual recognition surface Sv. The reflecting mirror 15 is not mounted on the vehicle 100, and the image display device 10 does not configure the virtual image display device 11.

Figure 12:
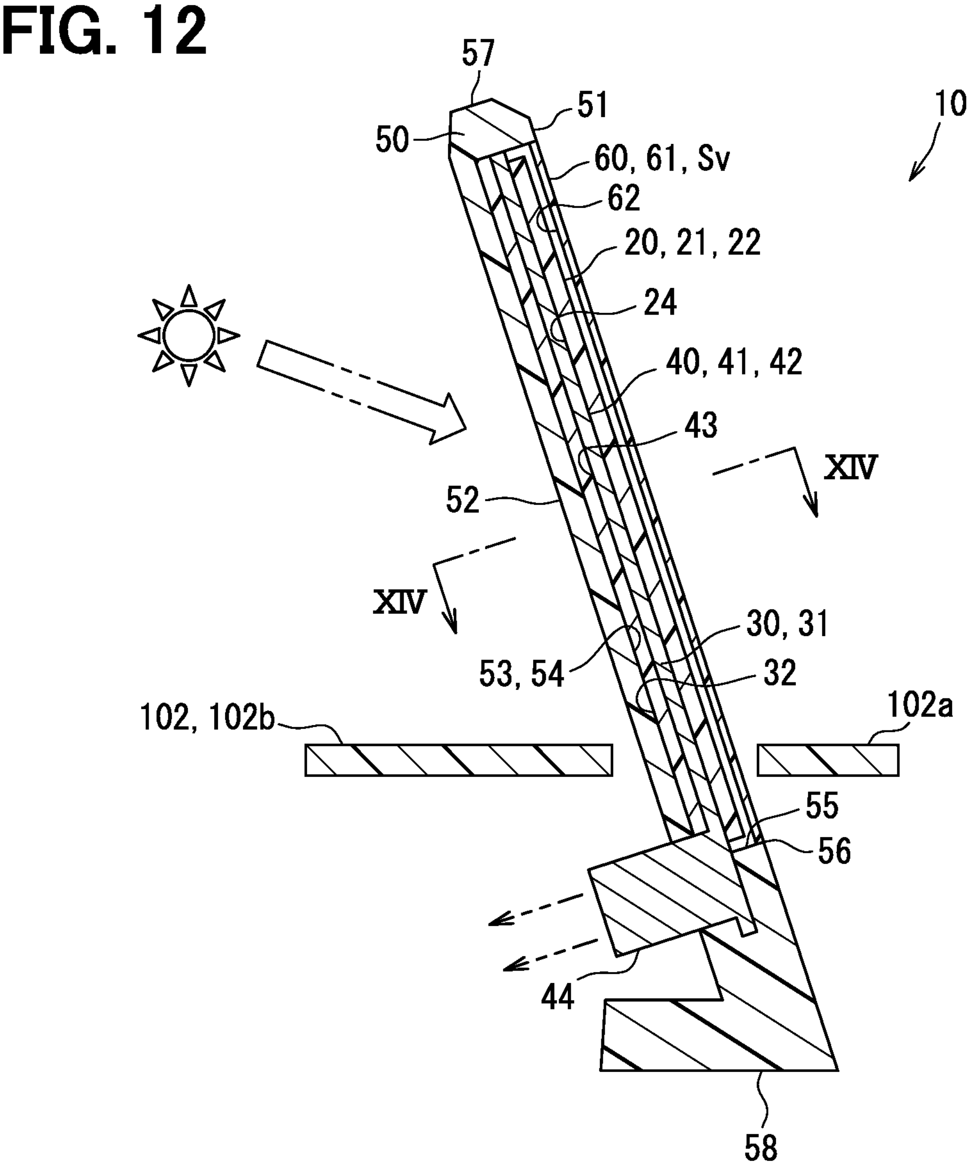
FIG. 12 is a diagram illustrating a longitudinal cross-sectional view of the image display device.
Figure 13:
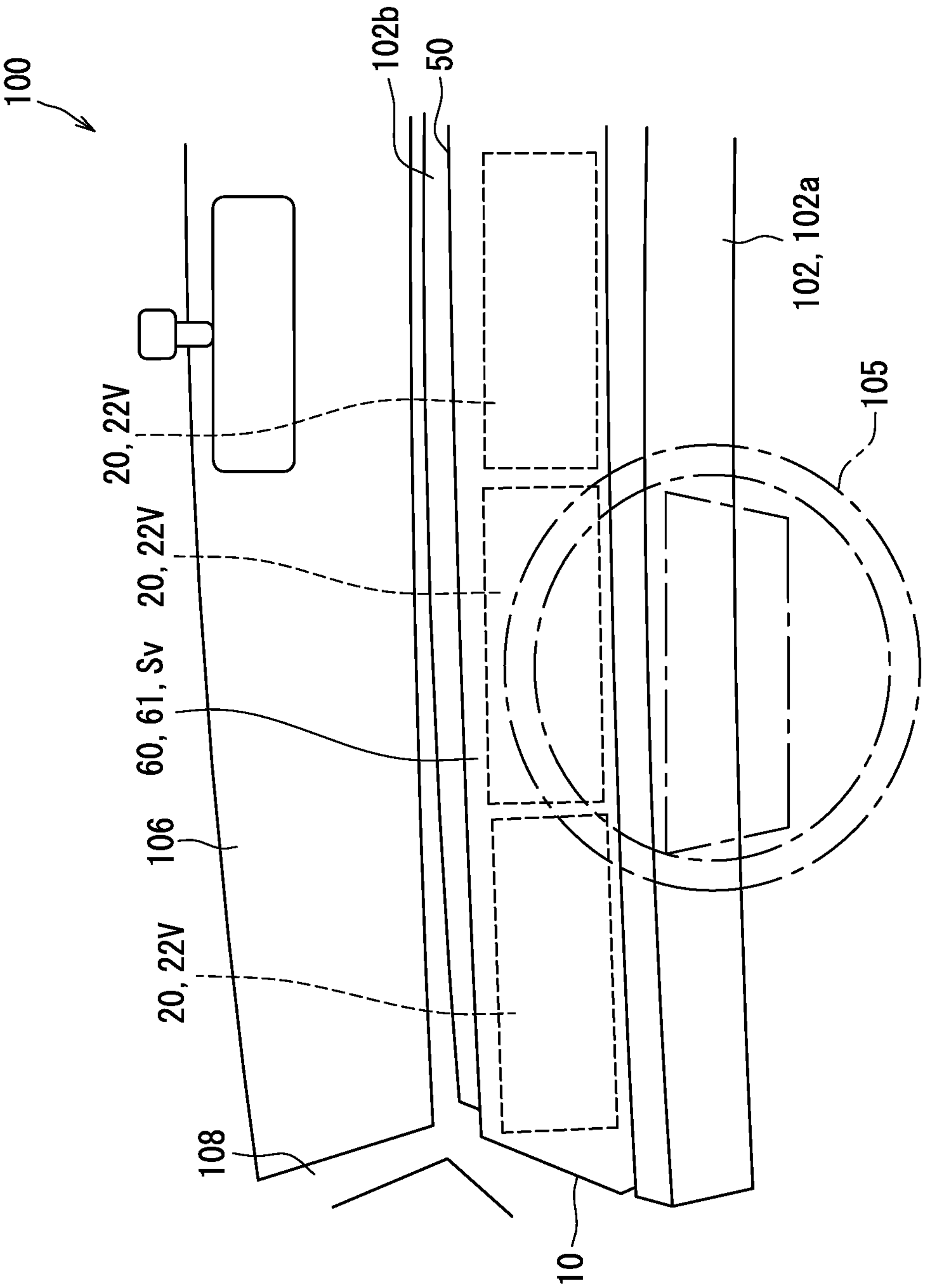
FIG. 13 is a diagram illustrating a configuration of a periphery of the image display device in a vehicle interior.
Figure 14:
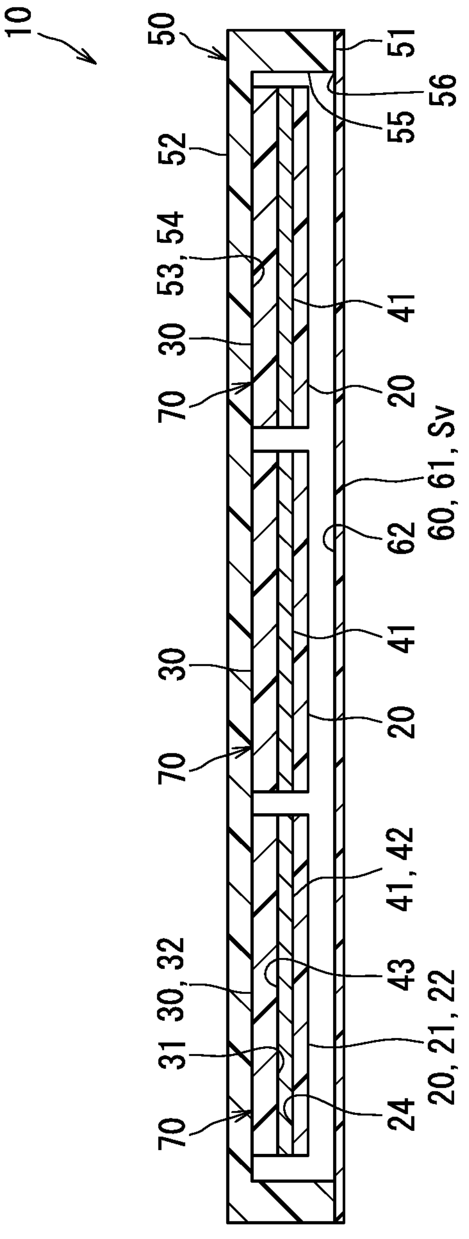
FIG. 14 is a diagram illustrating a transverse cross-sectional view of the image display device, and corresponds to a cross-sectional view taken along line XIV-XIV of FIG. 12.

The image display device 10 illustrated in FIGS. 11 to 14 is installed such that the cover front surface 61 is visually recognized. The cover front surface 61 is directed obliquely upward so as to face the seat side. The occupant sitting on the seat can easily visually recognize the cover front surface 61. In the present embodiment, the cover front surface 61 is the visual recognition surface Sv that is visually recognized by the occupant. The occupant can visually recognize the image V by visually recognizing the cover front surface 61 which is the visual recognition surface Sv. The image light emitted from display surface 22 is transmitted through hood cover 60 and advances toward the seat side. The occupant directly views the display surface 22 through the hood cover 60 instead of indirectly viewing the display surface 22 as in the first embodiment. In FIG. 13, illustration of the hood front surface 51 is omitted. In the present embodiment, the device thickness direction is a direction extending in the front-rear direction of the vehicle 100.

The image display device 10 is provided on the instrument panel 102 in a state in which the cover front surface 61 and the hood back surface 52 are exposed to the vehicle interior 101. The image display device 10 extends upward from the instrument panel 102. The image display device 10 is in a state of being interposed between the near portion 102*a* and the far portion 102*b*. The lower end portion of the image display device 10 is a basal end portion that entered the far side of the instrument panel 102 and is fixed to the instrument panel 102. The upper end portion of the image display device 10 is a distal end portion disposed above the far portion 102*b*. The cover front surface 61 extends in the vertical direction or a direction slightly inclined with respect to the vertical direction.

The image display device 10 is provided on the lower side of the front windshield 106. The display surface 22 and the cover front surface 61 face a direction different from that of the front windshield 106. When sunlight is transmitted through the front windshield 106 and enters the vehicle interior 101, the sunlight easily hits the hood back surface 52 but hardly hits the display surface 22 and the cover front surface 61.

As illustrated in FIG. 12, in the visor hood 50, the hood distal end portion 57 forms the upper end portion of the image display device 10, and the hood basal end portion 58 forms the lower end portion of the image display device 10. The visor hood is fixed to the instrument panel 102 with the hood basal end portion 58 disposed on the lower side of the near portion 102*a* and the far portion 102*b*.

In the heat dissipating part 40, the heat dissipation fin 44 is covered from above by the instrument panel 102. For example, the heat dissipation fin 44 is disposed below the far portion 102*b*, and is covered from above by the far portion 102*b*. In the vehicle interior 101, the irradiation of sunlight to the heat dissipation fin 44 is blocked by the instrument panel 102. Note that the position of the heat dissipation fin 44 may not be a position spaced apart from the hood recess 53 toward the hood basal end portion 58 side.

The present embodiment differs from the first embodiment mainly in the orientations of the display surface 22 and the cover front surface 61. Therefore, the effect exhibited by the image display device 10 of the first embodiment can be exhibited by the image display device 10 of the present embodiment. For example, the effect described in <Configuration group A> of the first embodiment is an effect that the image display device 10 of the present embodiment can also exhibit.

Third Embodiment

In the first embodiment, the two adjacent displays 20 are arranged side by side in the device width direction. On the other hand, in the third embodiment, the two adjacent displays 20 partially overlap each other in the device thickness direction. In the third embodiment, a configuration in which an overlapping configuration in which two displays 20 are overlapped in this manner is applied to the first embodiment will be described. This overlapping configuration may be applied to the second embodiment. Configurations, operations, and effects not specifically described in the third embodiment are the same as those of the first embodiment. In the third embodiment, differences from the first embodiment will be mainly described.

Figure 15:
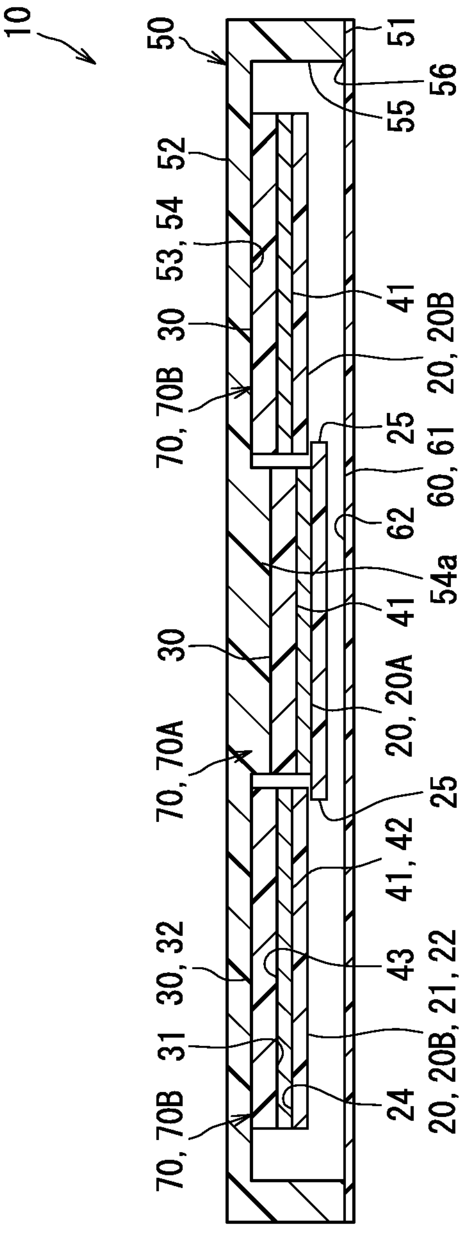
FIG. 15 is a diagram illustrating a transverse cross-sectional view of an image display device according to a third embodiment.

In the image display device 10 illustrated in FIG. 15, one of the two adjacent displays 20 is disposed on the near side of the other. Among these displays 20, the display 20 disposed on the near side is referred to as a near display 20A, and the display 20 disposed on the far side is referred to as a far display 20B. The near display and the far display 20B both extend in parallel to the recessed bottom surface 54 and the cover front surface 61. The plurality of displays 20 includes two far displays adjacent to each other via the near display 20A. One side end portion 25 of the near display 20A is on the near side of one far display 20B of the two far displays 20B. The other side end portion 25 is on the near side of the other far display 20B of the two far displays 20B.

A part of the display back surface 24 of the near display 20A and a part of the display front surface 21 of the far display 20B oppose each other and overlap each other. The side end portion 25 of the near display 20A is disposed at a position overlapping the far display 20B in the device thickness direction. The side end portion of the near display 20A is arranged on the near side of the display front surface 21 of the far display 20B. The near display 20A is disposed at a position that does not block the image light emitted from the far display 20B. For example, the side end portion 25 of the near display 20A is arranged at a position overlapping the frame surface 23 of the far display 20B, and is arranged at a position not overlapping the display surface 22 of the far display 20B.

The plurality of display units 70 include a near display unit 70A and a far display unit 70B. The near display unit 70A includes a near display 20A, and the far display unit 70B includes a far display 20B.

The visor hood 50 includes a bottom projection **54*a*. The bottom projection 54*a* is a projection in which a part of the recessed bottom surface 54 protrudes out toward the recessed opening 56. In the visor hood 50, a portion having the bottom projection 54*a* in a portion forming the recessed bottom surface 54 is partially thick. The distal end face of the bottom projection 54*a* is included in the recessed bottom surface 54. The near display 20A is located on the near side of the far display 20B by the thickness dimension of the bottom projection 54*a*. In the near display unit 70A, the heat insulating part 30 is superimposed on the distal end face of the bottom projection 54*a*. On the other hand, the heat insulating part 30 of the far display unit 70B is not superimposed on the bottom projection 54*a*, and is arranged side by side with the bottom projection 54*a* in the width direction. In the width direction, the heat insulating part 30 of the far display unit 70B and the bottom projection 54*a*** are at positions spaced apart from each other.

In the near display unit 70A and the far display unit 70B, the thickness dimension of each heat insulating part 30 and the thickness dimension of each heat dissipation plate portion 41 are the same. Furthermore, the thickness dimension of the near display 20A and the thickness dimension of the far display 20B are also the same. In the near display unit 70A, the width dimension of each of the heat insulating part 30 and the heat dissipation plate portion 41 is smaller than the width dimension of the near display 20A. The heat insulating part 30 and the heat dissipation plate portion 41 in the near display unit 70A are located at positions spaced apart in the width direction from all of the heat insulating part 30, the heat dissipation plate portion 41, and the far display 20B in the far display unit 70B.

Figure 16:
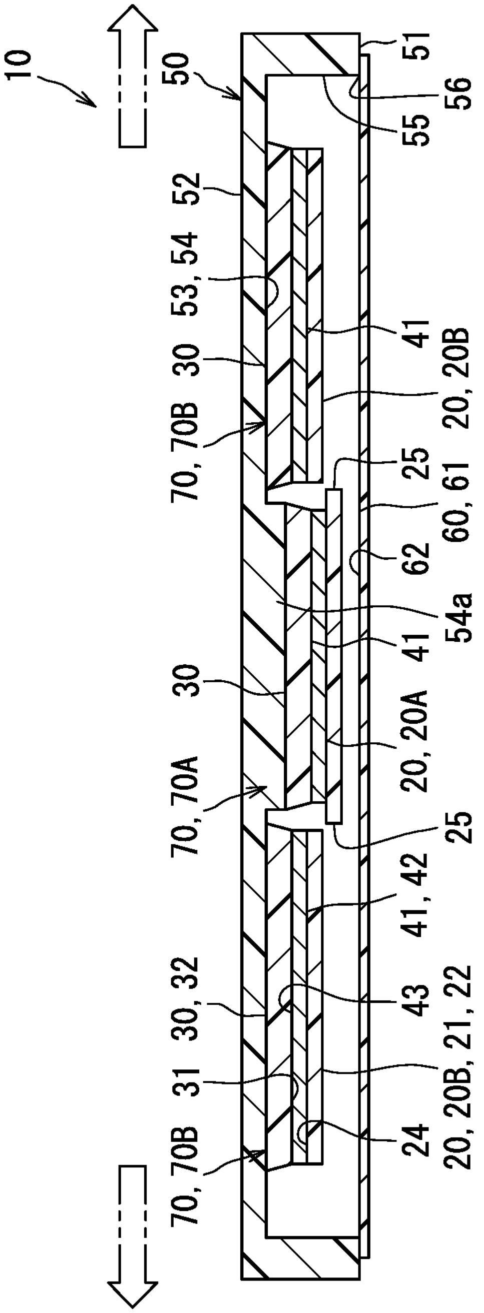
FIG. 16 is a diagram illustrating a transverse cross-sectional view of the image display device in a state in which a visor hood is linearly expanded.

According to the present embodiment, the heat insulating part 30 included in the near display unit 70A is located at a position spaced apart in the width direction from all of the heat insulating part 30, the heat dissipation plate portion 41, and the far display 20B included in the far display unit 70B. Furthermore, the heat insulating part of the far display unit 70B is located at a position spaced apart from the bottom projection **54*a* in the width direction. Therefore, for example, as illustrated in FIG. 16, even if the visor hood 50 is linearly expanded, each heat insulating part 30 of the near display unit 70A and the far display unit 70B can be elastically deformed so as to extend in the width direction. Therefore, even if the visor hood 50 has the bottom projection 54*a*, the occurrence of an abnormality in the image display device 10 due to the linear expansion of the visor hood 50 can be suppressed by the elastic deformation of the heat insulating part 30**.

According to the present embodiment, the visor hood 50 is partially thickened by the bottom projection **54*a*. In this configuration, the strength of the visor hood 50 can be partially increased by the bottom projection 54*a*. Therefore, it is preferable that the visor hood 50 having the bottom projection 54*a* is applied to the image display device 10 that requires high strength such as being likely to be applied with an external force. For example, it is preferable that the visor hood 50 having the bottom projection 54*a* is selectively adopted according to the use of the vehicle 100** and the vehicle type.

According to the present embodiment, the side end portion 25 of the near display 20A is provided at a position overlapping the display surface 22 of the far display 20B in the device thickness direction. Therefore, unlike a configuration in which there is a gap between the near display 20A and the far display 20B in the device thickness direction, a virtual image reflecting the gap is not included in the virtual image gap region. Therefore, the virtual image gap region can be suppressed from standing out due to the virtual image reflecting the gap for the occupant who has visually recognized the virtual image Vi.

<First Modification>

Figure 17:
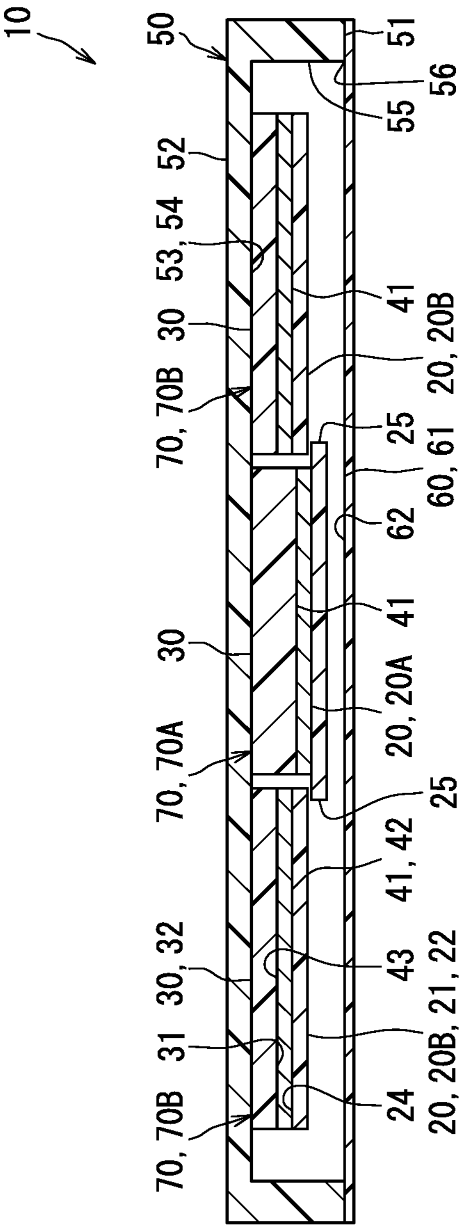
FIG. 17 is a diagram illustrating a transverse cross-sectional view of an image display device in a first modification of the third embodiment.

In the third embodiment, the thickness dimension of the heat insulating part may be different between the near display unit 70A and the far display unit 70B. In the first modification, as illustrated in FIG. 17, the visor hood 50 does not include the bottom projection **54*a*. The thickness dimension of the heat insulating part 30 of the near display unit 70A is larger than the thickness dimension of the heat insulating part of the far display unit 70B. The near display 20A is located on the near side of the far display 20B by the difference in the thickness dimension of the heat insulating part In the present modification, the thickness dimension of the respective heat dissipation plate portion 41 is the same in the near display unit 70A and the far display unit 70**B.

Figure 18:
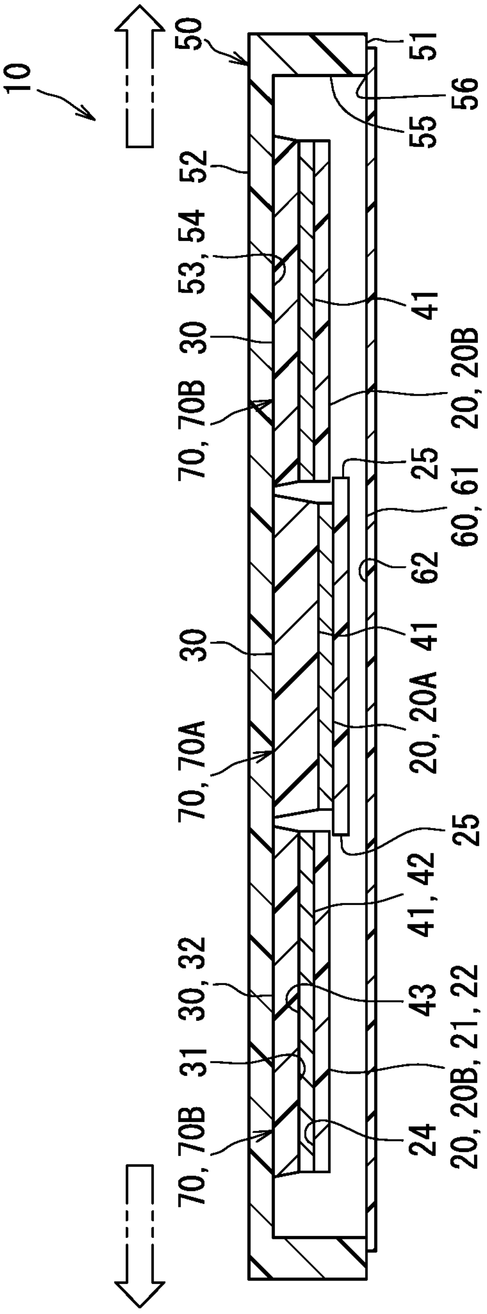
FIG. 18 is a diagram illustrating a transverse cross-sectional view of the image display device in a state in which a visor hood is linearly expanded.

In the present modification, the heat insulating part 30 included in the near display unit 70A is at a position spaced apart in the width direction from all of the heat insulating part 30, the heat dissipation plate portion 41, and the far display 20B in the far display unit 70B. Therefore, for example, as illustrated in FIG. 18, even if the visor hood 50 is linearly expanded, the near display unit 70A and the far display unit 70B do not interfere with each other, and the respective heat insulating parts 30 can be elastically deformed so as to extend in the width direction. Therefore, even if the thickness dimension of the heat insulating part 30 is different between the near display unit 70A and the far display unit 70B, the occurrence of abnormality in the image display device 10 involved in the linear expansion of the visor hood 50 can be suppressed by the elastic deformation of the heat insulating part 30.

According to the present modification, the heat insulating part 30 of the near display unit 70A is thicker than the heat insulating part 30 of the far display unit 70B. In this configuration, the heat insulating performance for the near display 20A is higher than the heat insulating performance for the far display 20B. Therefore, it is preferable that the near display unit 70A is provided at a portion of the visor hood 50 where the temperature is likely to become high. A portion of the visor hood 50 where the temperature is likely to become high includes, for example, a portion that is likely to be exposed to sunlight. In addition, when a portion of the visor hood 50 where the temperature is likely to become high varies depending on the use of the vehicle 100 and the vehicle type, the position of the near display unit 70A is preferably set according to the use of the vehicle 100 and the vehicle type.

<Second Modification>

Figure 19:
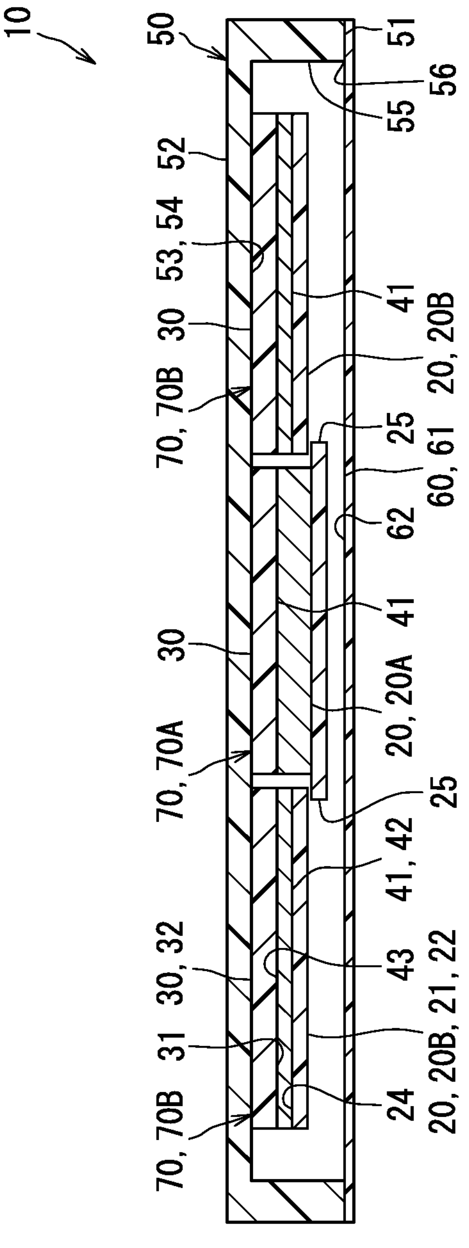
FIG. 19 is a diagram illustrating a transverse cross-sectional view of an image display device in a second modification of the third embodiment.

In the third embodiment, the thickness dimension of the heat dissipation plate portion 41 may be different between the near display unit 70A and the far display unit 70B. In second modification, as illustrated in FIG. 19, the thickness dimension of the heat dissipation plate portion 41 of the near display unit 70A is larger than the thickness dimension of the heat dissipation plate portion 41 of the far display unit 70B. The near display 20A is located on the near side of the far display 20B by the difference in the thickness dimension of the heat dissipation plate portion 41. In the present modification, the thickness dimension of the respective heat insulating part 30 is the same in the near display unit 70A and the far display unit 70B.

Figure 20:
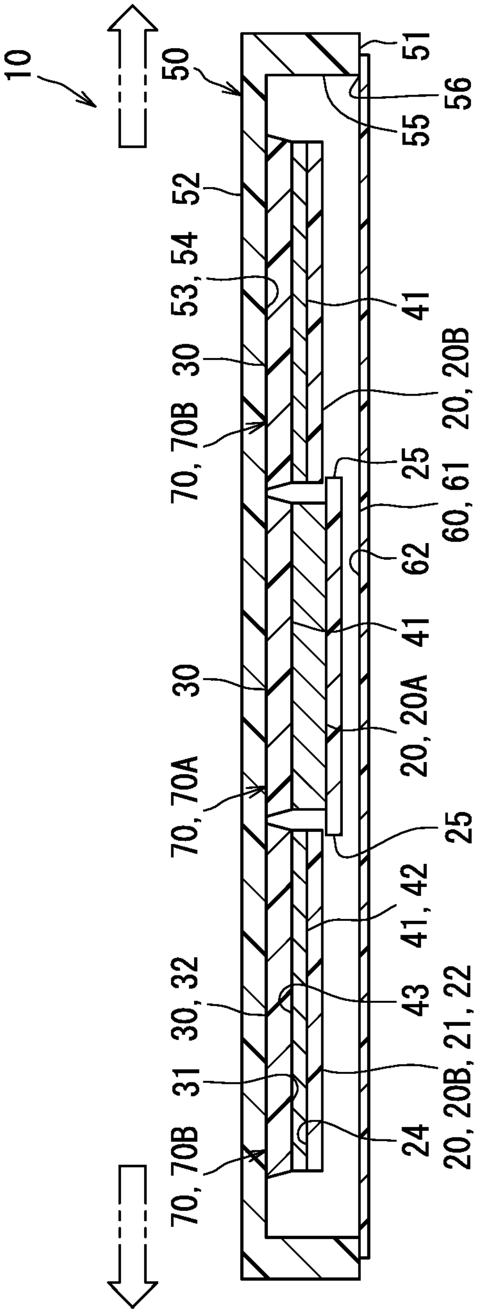
FIG. 20 is a diagram illustrating a transverse cross-sectional view of the image display device in a state in which a visor hood is linearly expanded.

In the present modification, the heat dissipation plate portion 41 in the near display unit 70A is at a position spaced apart in the width direction from all of the heat insulating part 30, the heat dissipation plate portion 41, and the far display 20B in the far display unit 70B. Therefore, for example, as illustrated in FIG. 20, even if the visor hood 50 is linearly expanded, the near display unit 70A and the far display unit 70B do not interfere with each other, and the respective heat insulating parts 30 can be elastically deformed so as to extend in the width direction. Therefore, even if the thickness dimension of the heat dissipation plate portion 41 is different between the near display unit 70A and the far display unit 70B, the occurrence of abnormality in the image display device 10 involved in the linear expansion of the visor hood 50 can be suppressed by the elastic deformation of the heat insulating part 30.

According to the present modification, the heat dissipation plate portion 41 of the near display unit 70A is thicker than the heat dissipation plate portion 41 of the far display unit 70B. In this configuration, the heat insulating performance for the near display 20A is higher than the heat insulating performance for the far display 20B. For this reason, it is preferable that the near display unit 70A is provided for, for example, the display 20 that easily generates heat among the plurality of displays 20. In addition, in a case where the heat generation mode of the display 20 varies according to the use of the vehicle 100 and the vehicle type, the position of the near display unit 70A is preferably set according to the use of the vehicle 100 and the vehicle type.

Fourth Embodiment

In the fourth embodiment, a correction process is performed on the image V so as not to cause distortion in the virtual image Vi. Configurations, operations, and effects not specifically described in the fourth embodiment are the same as those of the first embodiment. In the fourth embodiment, differences from the first embodiment will be mainly described.

Figure 21:
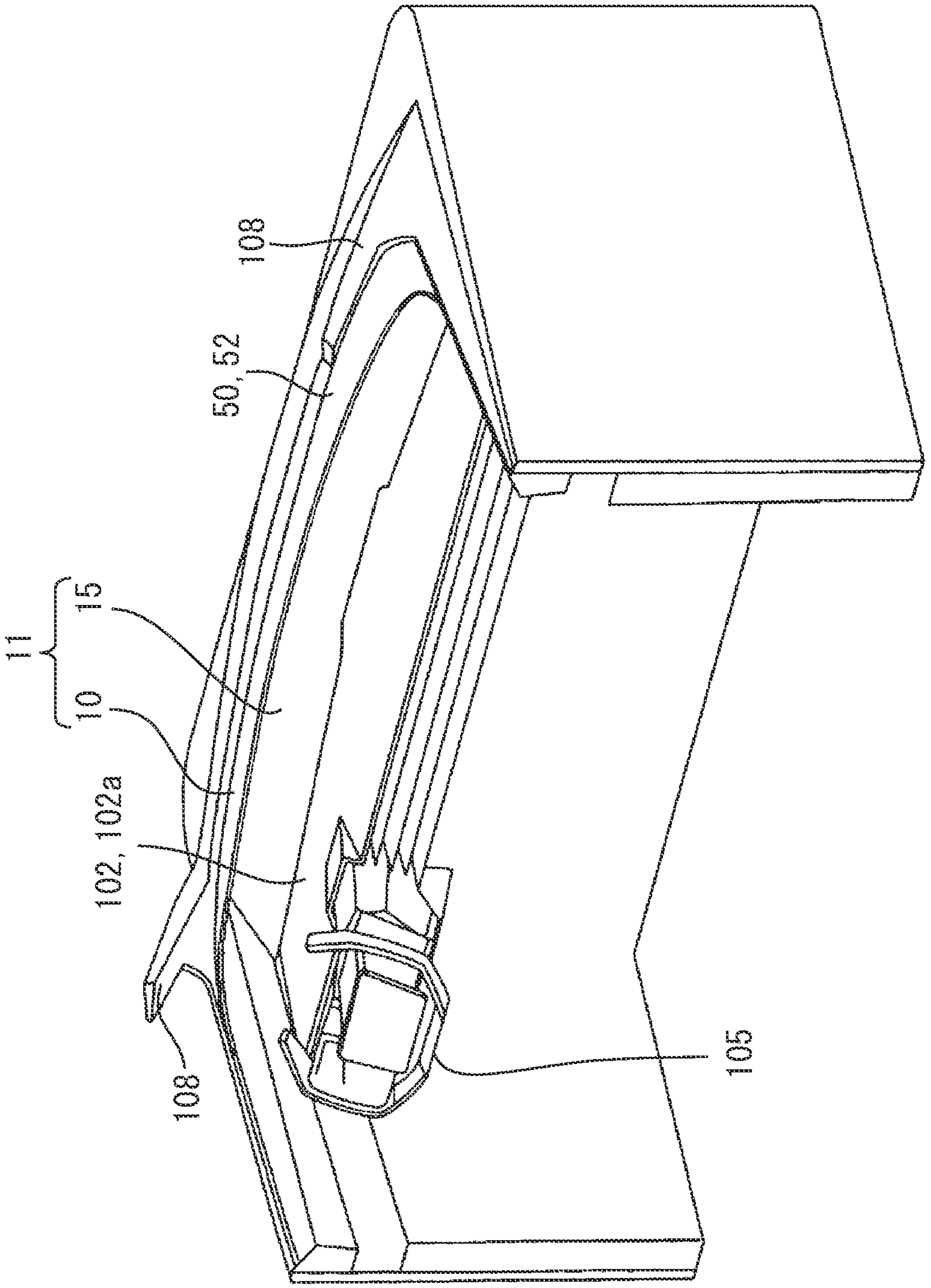
FIG. 21 is a diagram illustrating a perspective view of a configuration of the periphery of a virtual image display device in a vehicle interior according to a fourth embodiment.

As illustrated in FIG. 21, in the virtual image display device 11, the image display device 10 and reflecting mirror 15 are bent as a whole. The visor hood 50 and the reflecting mirror 15 are bridged across the pair of A-pillars 108. The visor hood 50 and the reflecting mirror 15 are curved such that the respective central portions bulge toward the front of the vehicle. The reflection surface 16 of the reflecting mirror 15 is a flat surface or a curved surface, and is one continuing continuous surface. The hood distal end portion 57 is curved such that a central portion of the hood distal end portion 57 in the vehicle width direction is recessed toward the hood basal end portion 58.

Figure 22:
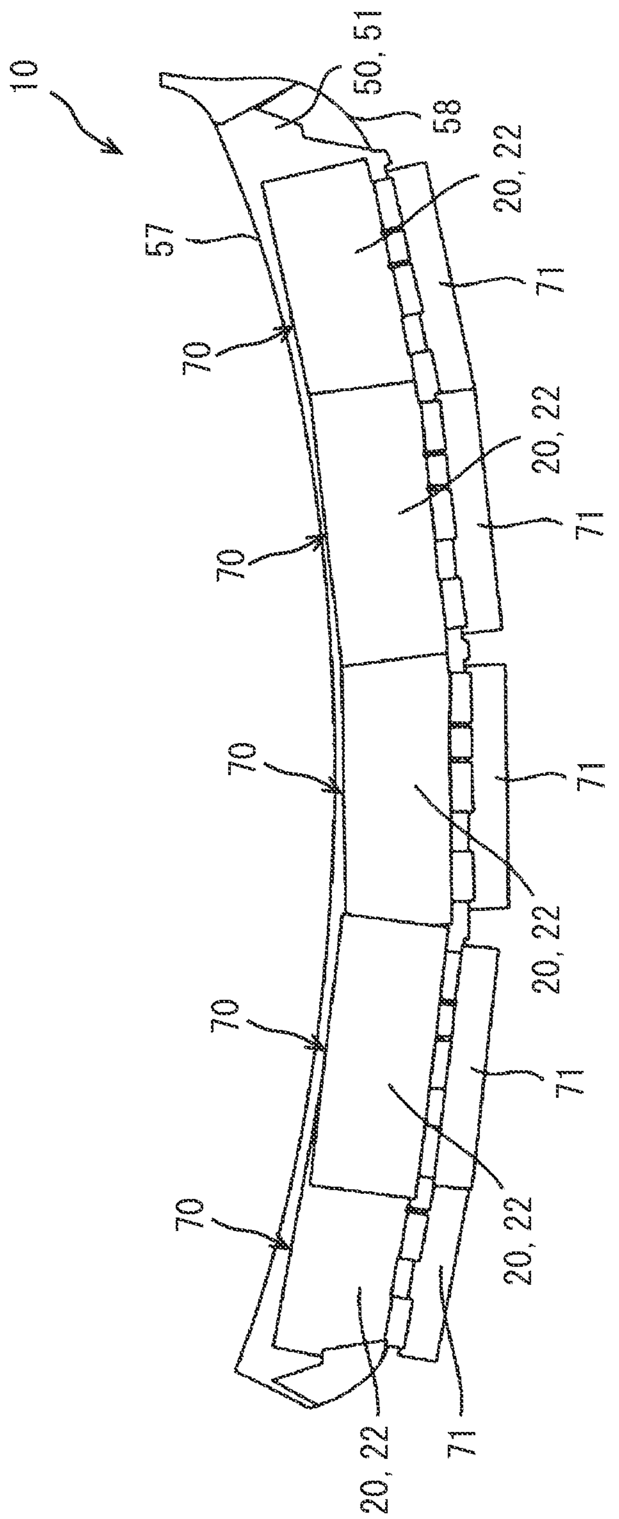
FIG. 22 is a diagram illustrating an arrangement of display units in the image display device.

As illustrated in FIG. 22, in the image display device 10, a plurality of display units 70 are arranged side by side along the hood distal end portion 57. A plurality of display units 70 are arranged side by side in the vehicle width direction. In each of the plurality of display units 70, the display 20 and the circuit board 71 are arranged side by side in the vehicle front-rear direction.

Figure 23:
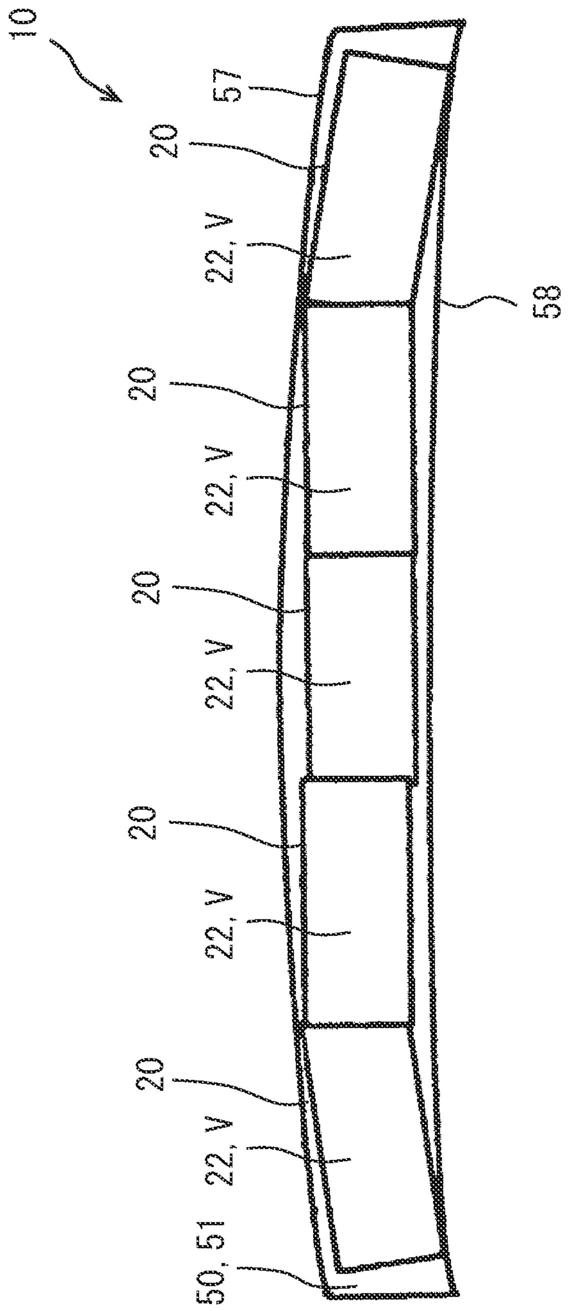
FIG. 23 is a diagram illustrating an arrangement of displays in the image display device.

As illustrated in FIG. 23, in the plurality of display units 70, the respective displays 20 are arranged side by side along the hood distal end portion 57. As long as the plurality of displays 20 are arranged side by side along the hood distal end portion 57, the display 20 may be inclined or may not be inclined with respect to the vehicle width direction. For example, of the two adjacent displays 20, one display 20 may be inclined or may not be inclined with respect to the other display 20. Note that in FIGS. 22 and 23, illustration of the hood cover 60 is omitted.

Figure 24:
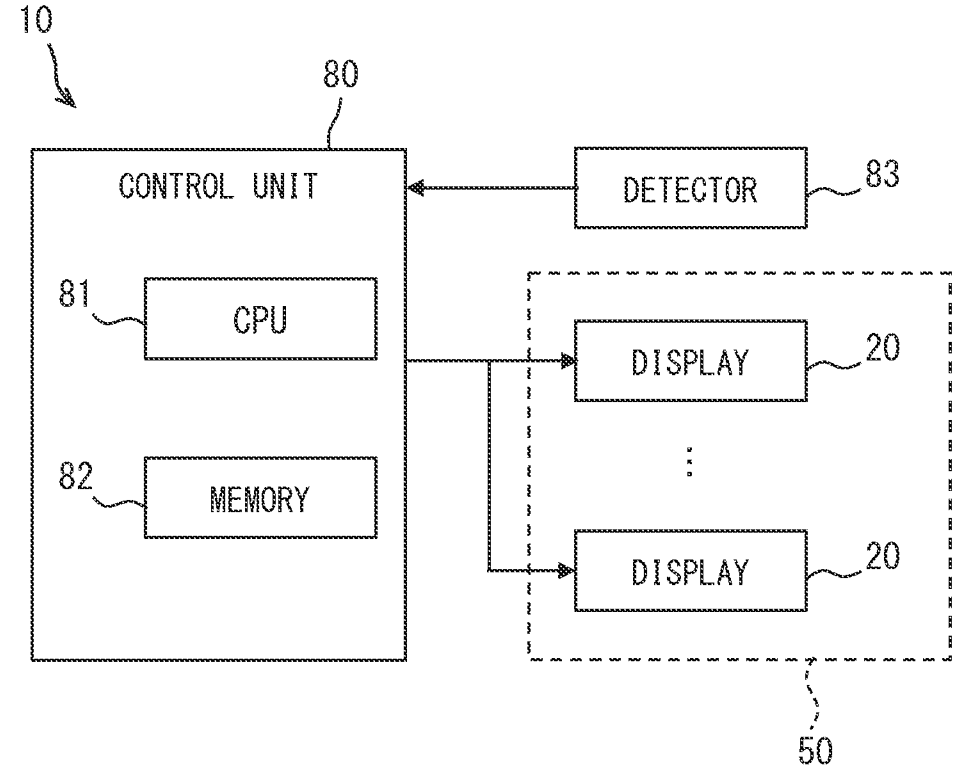
FIG. 24 is a block diagram illustrating an electrical configuration of the image display device.

As illustrated in FIG. 24, the image display device 10 includes a control unit and a detection unit 83. The control unit 80 is electrically connected to each of the plurality of displays 20, and individually controls each of the displays 20. The control unit 80 controls the display 20 through, for example, a driver circuit.

The control unit 80 is, for example, an ECU and corresponds to a control device. The ECU is an abbreviation for Electronic Control Unit. The control unit 80 includes a CPU 81 serving as an arithmetic processing device and a memory 82 serving as a storage device. The CPU 81 is a processor. The control unit 80 is mainly configured by a microcomputer including, for example, a CPU 81, a memory 82, an I/O, and a bus that connects these components. The control unit 80 executes various processes related to driving of the display 20 by executing the control program stored in the memory 82. The memory 82 is a non-transitory tangible storage medium that non-transiently stores computer-readable programs and data. In addition, the non-transitory tangible storage medium is realized by a semiconductor memory, a magnetic disk, or the like.

The detection unit 83 is electrically connected to the control unit 80. The detection unit 83 detects the brightness of the external light with which the reflection surface 16 is irradiated and outputs a detection signal indicating the brightness to the control unit 80. The detection unit 83 is provided at a position on the near side of the reflection surface 16 in the instrument panel 102. The control unit 80 measures the brightness of the external light with which the reflection surface 16 is irradiated as the external light brightness by using the detection signal of the detection unit 83, and controls the display 20 according to the external light brightness. The control unit 80 adjusts, for example, the color, luminance, image quality, and the like of the image V according to the external light brightness. For example, in a case where the measurement value of the external light brightness is high due to, for example, the reflection surface 16 being irradiated with the evening sun or the morning sun, the control unit 80 sets the brightness and the luminance of the image V to be high.

Note that the detection unit 83 may be provided at a position where brightness of external light with which the display surface 22 is irradiated is detected. Furthermore, the detection unit 83 may be provided at at least one of a position where the brightness of the external light with which the reflection surface 16 is irradiated is detected and a position where the brightness of the external light with which the display surface 22 is irradiated is detected. In this configuration, the control unit 80 measures at least one of the external light brightness on the reflection surface 16 and the external light brightness on the display surface 22, and controls the display 20 according to the measured external light brightness.

It is conceivable that the virtual image Vi displayed by the reflection surface 16 is distorted with respect to the image V displayed by the display surface 22. Examples of the configuration in which the virtual image Vi is distorted include, for example, a configuration in which the reflection surface 16 is relatively curved in the device thickness direction or the vehicle front-rear direction with respect to the display surface 22.

Figure 25:
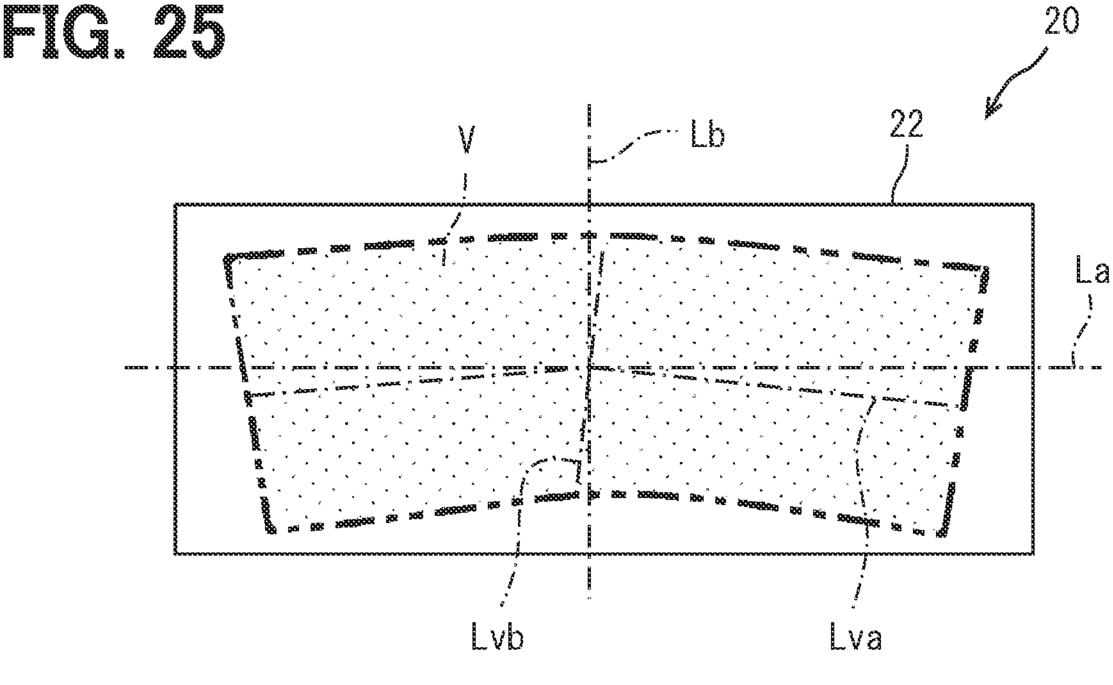
FIG. 25 is a diagram for explaining an image displayed on a display surface.

The control unit 80 performs a distortion correction process of correcting the image V so that the virtual image Vi is not distorted. As the distortion correction process, for example, the control unit 80 performs a process of intentionally distorting the image V with respect to the display surface 22 so as to cancel out the distortion of the virtual image Vi. For example, as illustrated in FIG. 25, the control unit 80 performs the distortion correction so that the horizontal center line Lva of the image V is inclined with respect to the horizontal center line La of the display surface 22 and the vertical center line Lvb of the image V is inclined with respect to the vertical center line Lb of the display surface 22. In the image V and the display surface 22, the horizontal center lines Lva and La extend in the lateral direction of the display surface 22, and the vertical center lines Lvb and Lb extend in the vertical direction of the display surface 22. In the image V and the display surface 22, the lateral direction is the longitudinal direction, and the vertical direction is the short direction. For example, the lateral direction of the display surface 22 is the vehicle width direction, and the vertical direction of the display surface 22 is the vehicle front-rear direction.

Figure 26:
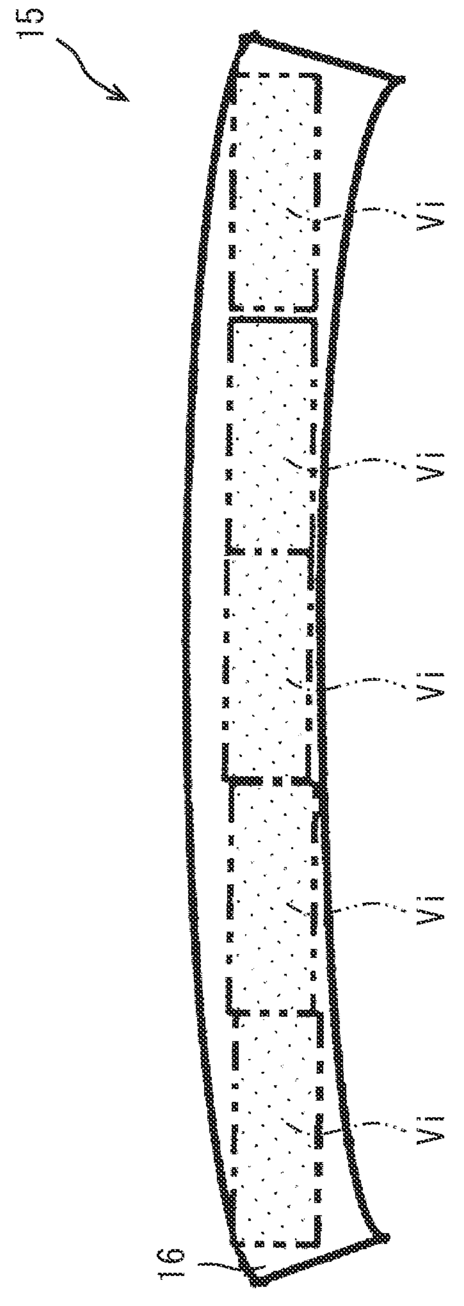
FIG. 26 is a diagram for explaining a virtual image displayed by a reflection surface.

In a case where the distortion correction process is performed by the control unit 80, the distortion of the virtual image Vi is resolved. For example, as illustrated in FIG. 26, in a case where the distortion is resolved for each of the plurality of virtual images Vi, the horizontal center lines Lva of the respective virtual images Vi become parallel to or coincide with each other and extend in the vehicle width direction. In addition, the vertical center lines Lvb of the virtual images Vi become parallel to or coincide with each other, and extend in the vehicle front-rear direction.

Figure 27:
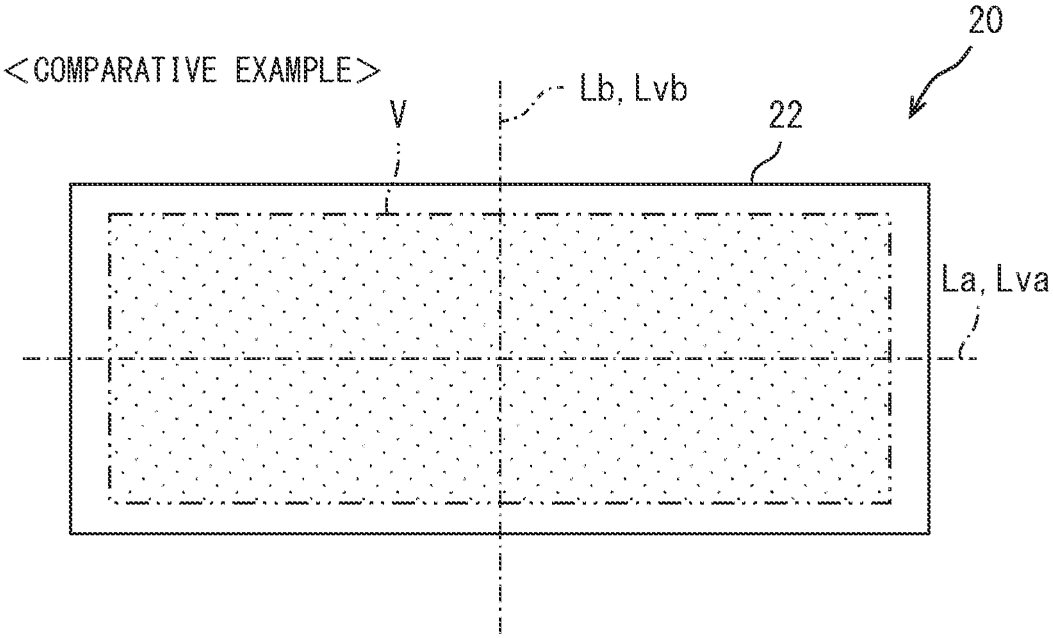
FIG. 27 is a diagram for explaining an image displayed by a display surface in a comparative example.
Figure 28:
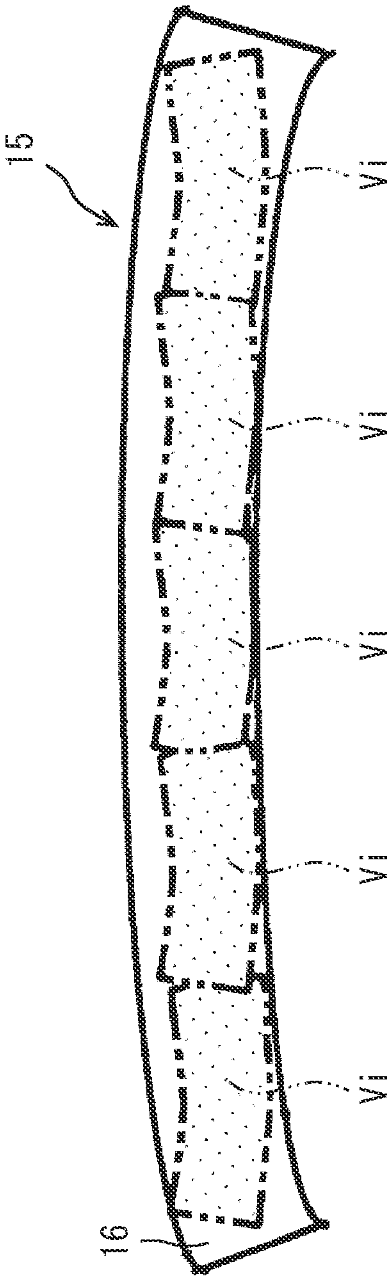
FIG. 28 is a diagram for explaining a virtual image displayed by a reflection surface in a comparative example.

For example, unlike the present embodiment, when the control unit 80 does not perform the distortion correction, the image V is not distorted with respect to the display surface 22 as illustrated in FIG. 27. In this state, the horizontal center lines Lva and La of the image V and the display surface 22 are parallel to or coincide with each other. Similarly, the respective vertical center lines Lvb and Lb are parallel to or coincide with each other. In a state where the image V is not distorted with respect to the display surface 22 as described above, virtual image Vi is distorted with respect to both the image V and the reflection surface 16 as illustrated in FIG. 28.

<Third Modification>

Figure 29:
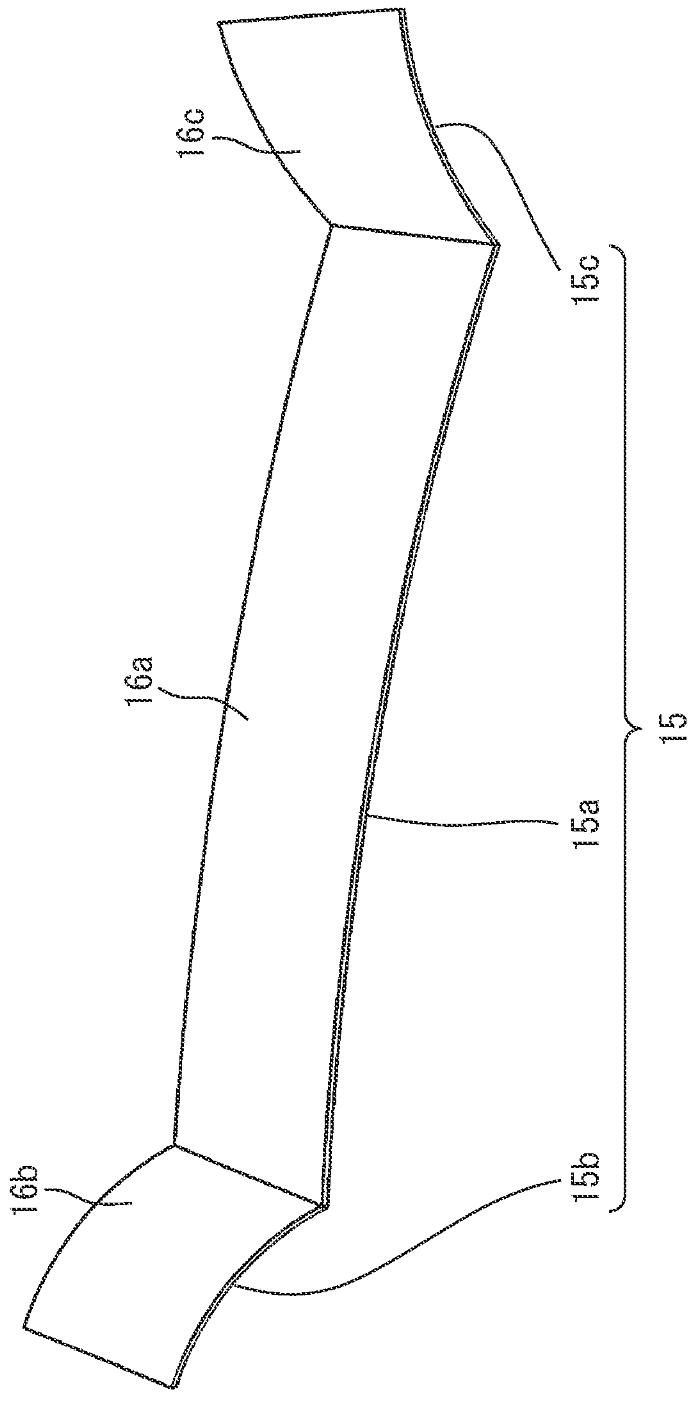
FIG. 29 is a diagram illustrating a perspective view of a reflecting mirror in a third modification of the fourth embodiment.

The reflection surface 16 may have a plurality of continuous surfaces instead of being one continuous surface. In the third modification, for example, in the fourth embodiment, as illustrated in FIG. 29, the reflecting mirror 15 includes a center mirror 15*a* and a pair of side mirrors 15*b* and 15*c*. The center mirror 15*a* extends in the vehicle width direction and faces the seat side. The center mirror 15*a* is provided between the pair of side mirrors 15*b* and 15*c*, and connects these side mirrors 15*b* and 15*c*. The center mirror 15*a* and the side mirrors 15*b* and 15*c* are all formed to a plate shape. In the reflecting mirror 15, one end portion in the vehicle width direction is formed by the side mirror 15*b*, and the other end portion is formed by the side mirror In the reflecting mirror 15, the side mirror 15*b* is fixed to one of the pair of A-pillars 108, and the side mirror 15*c* is fixed to the other A-pillar.

The reflection surface 16 has a center surface 16*a* and a pair of side surfaces 16*b* and 16*c*. The center surface 16*a* is formed by one plate surface of the center mirror 15*a* and faces the seat side. The side surfaces 16*b* and 16*c* are formed by one plate surface of the side mirrors 15*b* and 15*c*. The side surfaces 16*b* and 16*c* are each inclined with respect to the center surface 16*a*, and face the seat side so as to face the center surface 16*a* side. For this reason, the side surface 16*b* close to one of the two seats arranged side by side in the vehicle width direction is also easily viewed from the other seat. Similarly, the side surface 16*c* close to the other seat is easily viewed from the one seat.

The side surfaces 16*b* and 16*c* are bent with respect to the center surface 16*a*, and a bent angle thereof is, for example, an obtuse angle. The side surfaces 16*b* and 16*c* are curved such that, for example, the respective central portion bulges toward the seat side. In the reflection surface 16, one end portion in the vehicle width direction is formed by the side surface 16*b*, and the other end portion is formed by the side surface 16*c*.

The side surfaces 16*b* and 16*c* can display an image V obtained by imaging the periphery of the vehicle 100 as a virtual image Vi. For example, when the side surface 16*b* is on the right side for the driver, an image V obtained by imaging the right side of the vehicle is displayed as the virtual image Vi on the side surface 16*b*. When the side surface 16*c* is on the left side for the driver, an image V obtained by imaging the left side of the vehicle is displayed as the virtual image Vi on the side surface 16*c*. In this case, the side surfaces 16*b* and 16*c* correspond to electronic mirrors functioning as side mirrors. Examples of the side mirror include a door mirror and a fender mirror.

Fifth Embodiment

In the fifth embodiment, similarly to the third embodiment, parts of the two adjacent displays 20 overlap each other in the image surface thickness direction. In this configuration, in the fifth embodiment, the side end portion 25 of the near display is provided at a position overlapping the display surface 22 of the far display 20B. Configurations, operations, and effects not specifically described in the fifth embodiment are the same as those of the third embodiment. In the fifth embodiment, differences from the third embodiment will be mainly described.

Figure 30:
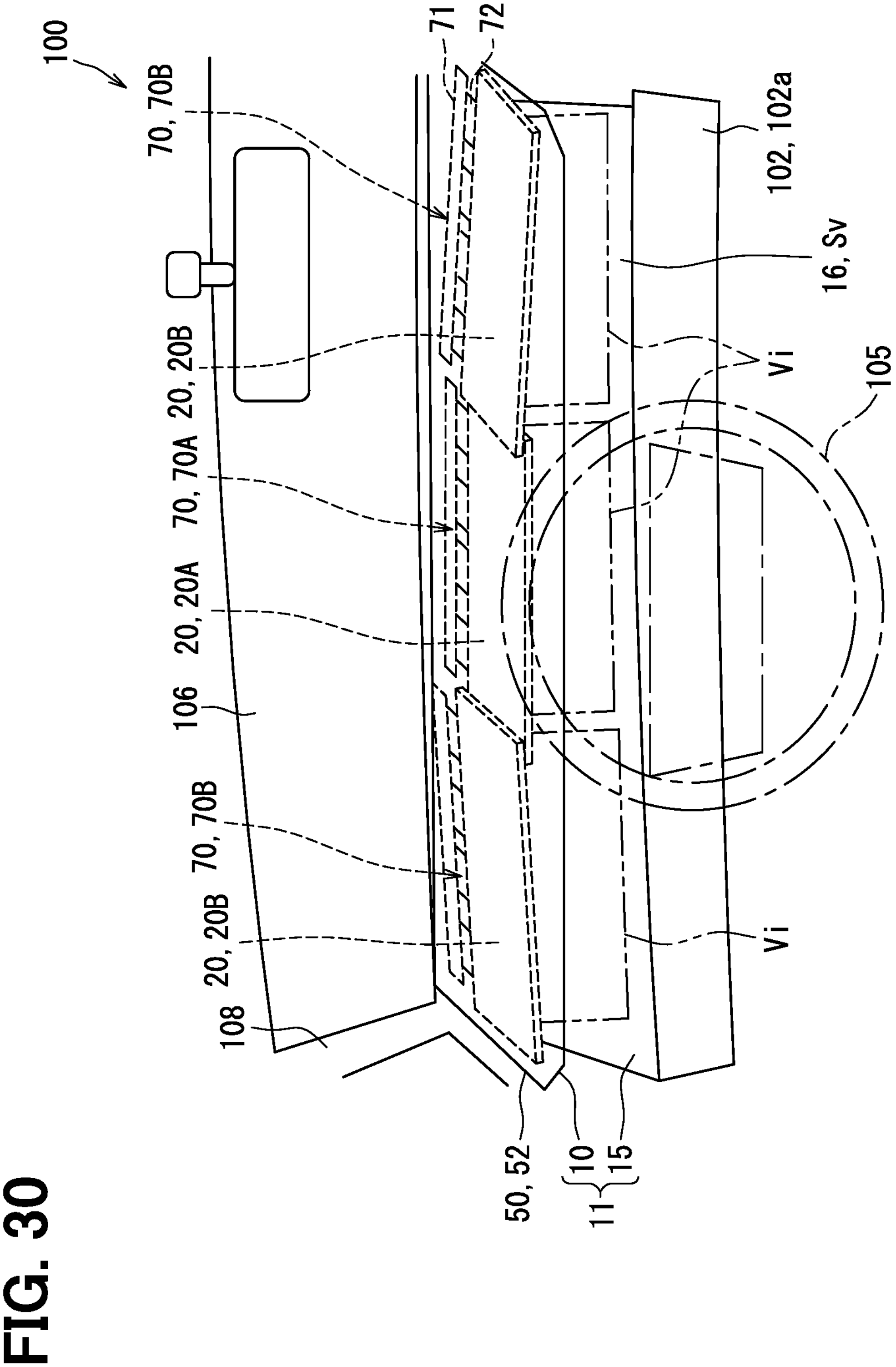
FIG. 30 is a diagram illustrating a configuration of the periphery of a virtual image display device in a vehicle interior according to a fifth embodiment.

As illustrated in FIG. 30, in the image display device 10, the near display and the far display 20B are provided with the respective display surfaces 22 facing downward. The side end portion 25 of the near display 20A is arranged on the lower side of the display surface 22 of the far display 20B.

Figure 31:
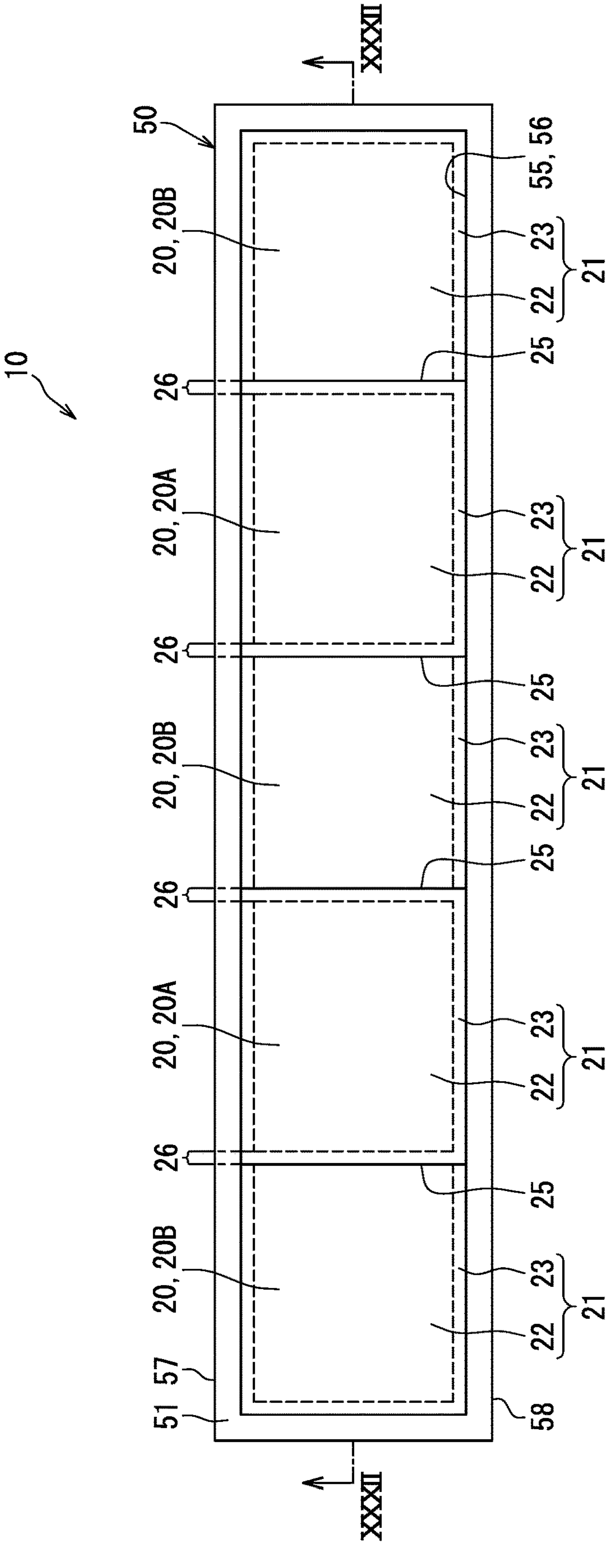
FIG. 31 is a diagram illustrating a front view of the image display device as viewed from a display surface side.

As illustrated in FIG. 31, the display overlapping portion 26 exists in the image display device 10. The display overlapping portion 26 is a portion where the near display 20A and the far display 20B overlap each other in the device thickness direction. In the display overlapping portion 26, a display back surface 24 of the near display 20A and a display front surface 21 of the far display 20B are superimposed with each other.

Figure 32:
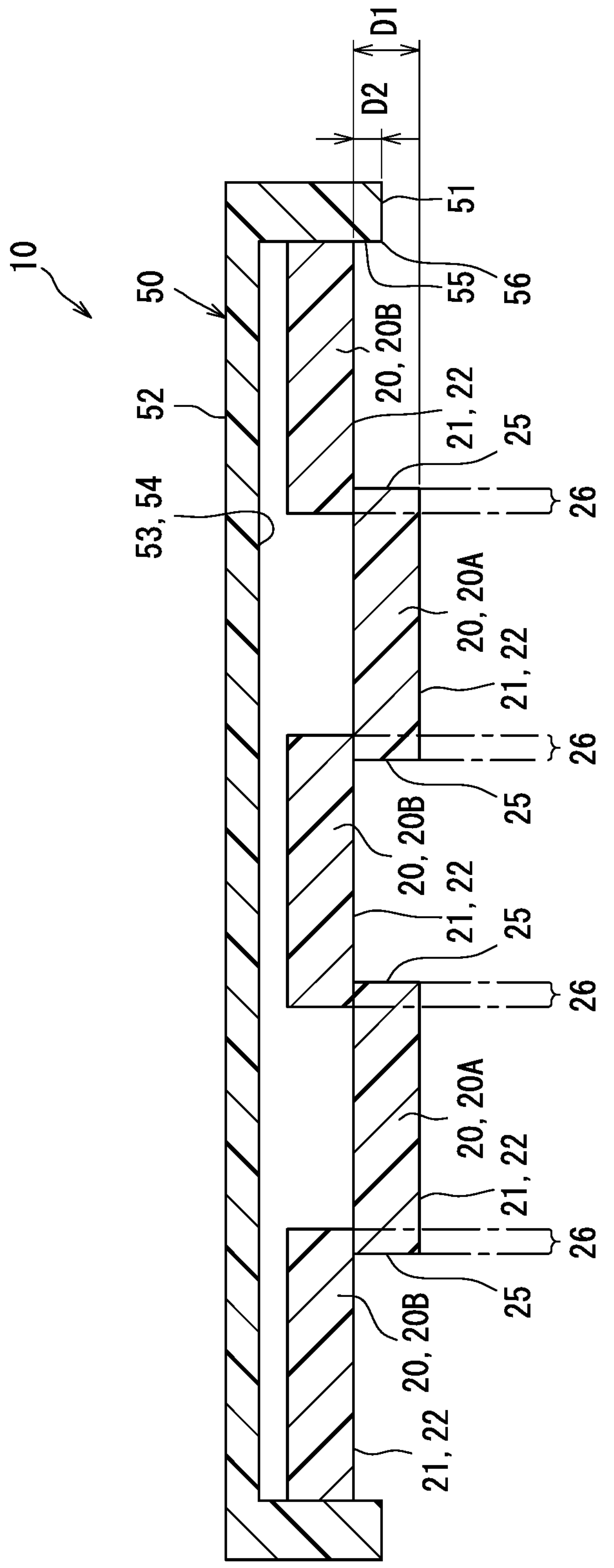
FIG. 32 is a diagram illustrating a cross-sectional view taken along line XXXII-XXXII of FIG. 31.

As illustrated in FIG. 32, the near display 20A is accommodated in the visor hood 50 in a state of protruding from the recessed opening 56. On the other hand, the far display 20B is accommodated in the visor hood 50 in a state of not protruding from the recessed opening 56. The far display 20B has a thickness dimension D1. The thickness dimension of the near display 20A and the thickness dimension of the far display 20B are the same. A protruding dimension D2 of the far display 20B from the recessed opening 56 is smaller than the thickness dimension D1. For example, the protruding dimension D2 is equal to or less than ½ of the thickness dimension D1. Note that in the present embodiment, the image display device 10 does not include the hood cover 60. Furthermore, in FIG. 32, illustration of the heat insulating part 30 and the heat dissipating part 40 is omitted.

Figure 33:
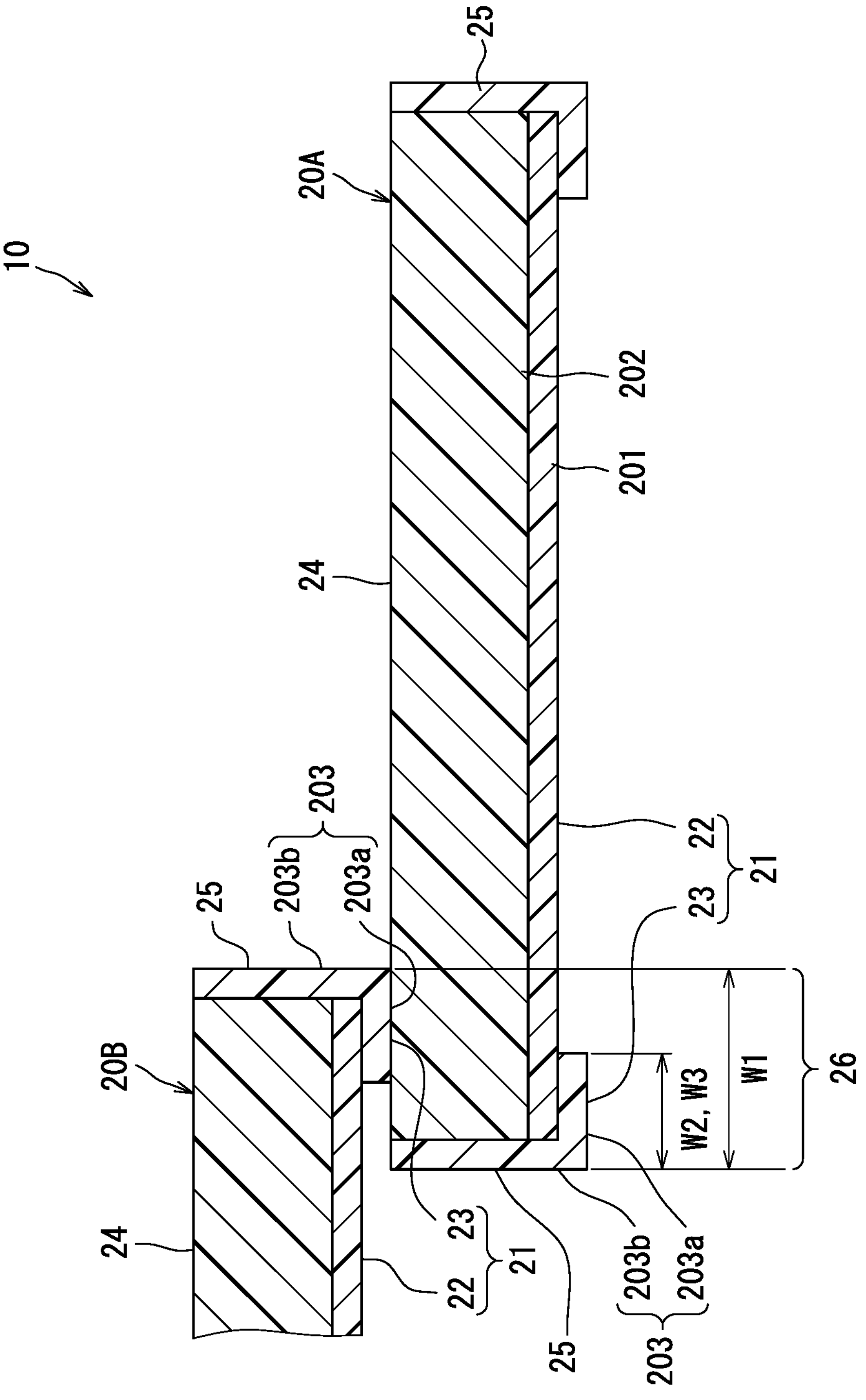
FIG. 33 is a diagram illustrating a transverse cross-sectional view of the periphery of a display overlapping portion.

As illustrated in FIG. 33, each of the plurality of displays 20 includes a display body 201, a polarizing plate 202, and a display frame portion 203. The display body 201 is, for example, an organic EL display, and is formed in a plate shape. The polarizing plate 202 is superimposed on a plate surface of the display body 201, and fixed to the display body 201. The polarizing plate 202 forms the display front surface 21. The polarizing plate 202 forms both the display surface 22 and the frame surface 23. The polarizing plate 202 has, for example, a transmission axis and an absorption axis orthogonal to each other, and transmits light changed in the transmission axis direction and absorbs light changed in the absorption axis direction.

The display frame portion 203 extends along the outer peripheral edge of the display body 201 and is formed in a frame shape. The display frame portion 203 forms a side end portion 25 and a frame surface 23. The display frame portion 203 is made of a resin material or the like. For example, the display frame portion 203 is formed by applying paint to the display body 201 and the polarizing plate 202. The display frame portion 203 has a dark color such as black having low brightness. In the display frame portion 203, light reflectivity is low. The display frame portion 203 is a reflection suppressing portion that suppresses reflection of light. When light such as image light strikes the display frame portion 203, the light is less likely to be reflected by the display frame portion 203. Processing such as applying paint to form the display frame portion 203 is a reflection suppressing process.

The display frame portion 203 has a frame front surface portion 203*a* and a frame edge portion 203*b*. The frame front surface portion 203*a* is a portion for forming the frame surface 23, and for example, is superimposed on the polarizing plate 202. The frame edge portion 203*b* is a portion for forming an edge surface of the display 20, and is superimposed on each end face of the display body 201 and the polarizing plate 202. The side end portion 25 is formed by the frame edge portion 203*b*.

The display frame portion 203 of the near display 20A is placed across the display surface 22 and the frame surface 23 of the far display 20B in the deice width direction. In the device width direction, the width dimension W1 of the display overlapping portion 26 is larger than the width dimension W2 of frame surface 23 formed by the frame front surface portion 203*a*. In the device width direction, a separation distance W3 between the display surface 22 of the near display 20A and the display surface 22 of the far display 20B is the same as the width dimension W2. On the other hand, the separation distance W3 is smaller than the width dimension W1.

For example, unlike the present embodiment, a configuration in which the side end portion 25 of the near display 20A is arranged in front of the frame surface 23 of the far display 20B is assumed. In this configuration, in the device width direction, at least a part of the frame surface 23 of the far display 20B is exposed between the display surface 22 of the near display 20A and the display surface 22 of the far display 20B. Therefore, in the device width direction, both the frame surface 23 of the near display 20A and the frame surface 23 of the far display 20B are exposed between the two adjacent display surfaces 22. As a result, the separation distance W3 becomes larger than the width dimension W2.

On the other hand, according to the present embodiment, the entire frame surface 23 of the far display 20B is hidden on the far side of the near display 20A. Therefore, in the device width direction, the frame surface 23 of the far display 20B is not exposed between the two adjacent display surfaces 22. As a result, the separation distance W3 becomes the same as the width dimension W2. As described above, when the separation distance W3 becomes the same as the width dimension W2, the width dimension of the virtual image gap region becomes smaller as compared with the configuration in which the separation distance W3 is larger than the width dimension W2 as described above. Therefore, the virtual image gap region can be suppressed from standing out when the occupant visually recognizes the virtual image Vi.

Figure 34:
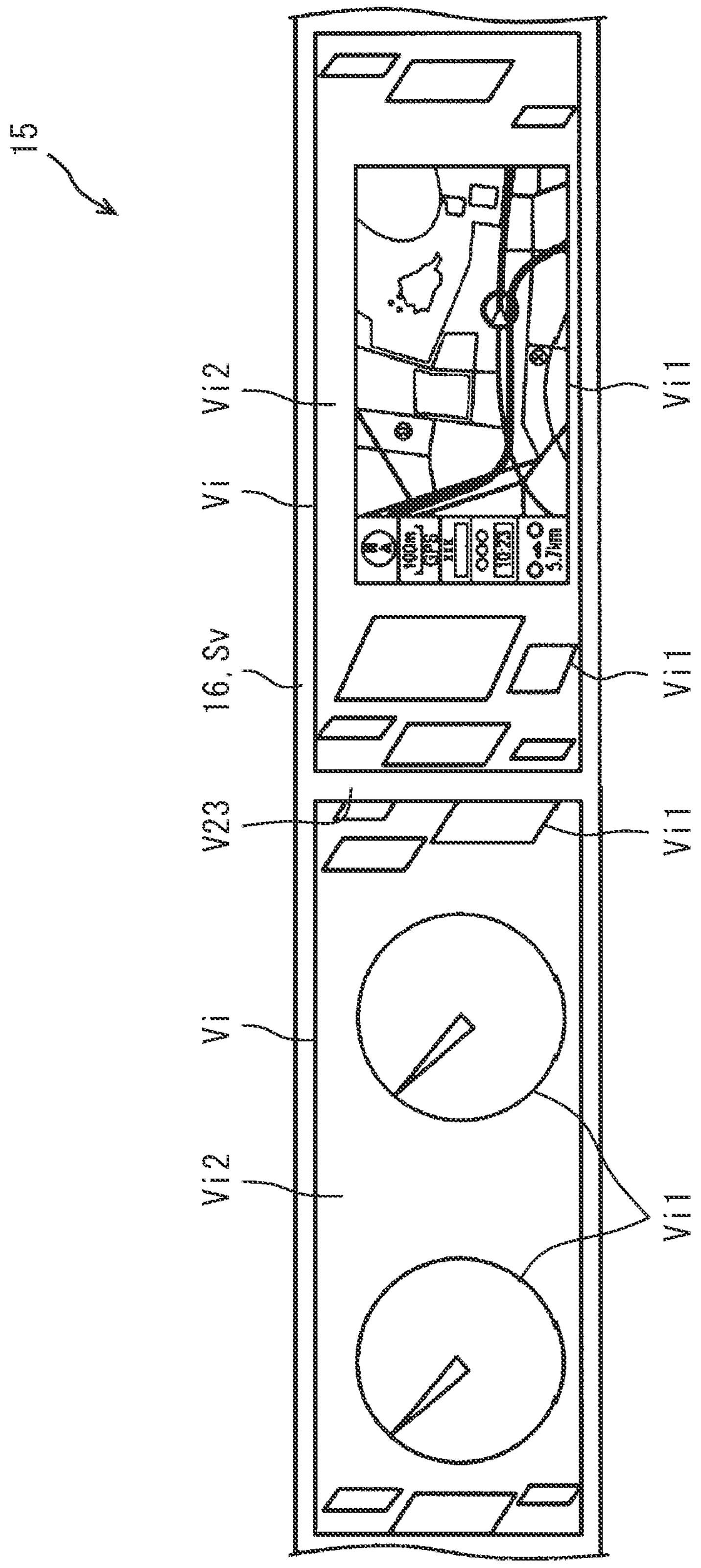
FIG. 34 is a diagram illustrating a virtual image displayed by a reflection surface.

As illustrated in FIG. 34, a virtual image gap region is displayed between two adjacent virtual images Vi in the visual recognition surface Sv. In this virtual image gap region, a frame surface 23 of the near display 20A is displayed as a virtual image V23. However, the virtual image V23 is slightly displayed so as to be hardly visually recognized by the occupant. The virtual image Vi includes an information virtual image Vi1 and a background virtual image Vi2. The information virtual image Vi1 is a virtual image that displays various types of information such as vehicle information. The background virtual image Vi2 is a virtual image that displays a background for the information virtual image Vi1. The background virtual image Vi2 extends along the virtual image V23 that displays the frame surface 23, and is displayed at a position adjacent to the virtual image V23. It is conceivable that the background virtual image Vi2 is displayed between the information virtual image Vi1 and the virtual image V23. The information virtual image Vi1 may be referred to as a first virtual image, and the background virtual image Vi2 may be referred to as a second virtual image.

The image display device 10 includes a control unit 80 similar to the third embodiment. The control unit 80 causes the display 20 to display the image V in which the occupant cannot identify the virtual image V23 indicating the frame surface 23 and the background virtual image Vi2. For example, the control unit 80 controls the display 20 so that at least one of hue, saturation, and brightness of the background virtual image Vi2 is the same as or close to the virtual image V23. As a result, it is possible to prevent the virtual image V23 from standing out with respect to the background virtual image Vi2 and the occupant from feeling uncomfortable.

According to the present embodiment, the display frame portion 203 is a reflection suppressing portion. In this configuration, the image light emitted from the far display 20B is less likely to be reflected by the display frame portion 203 of the near display 20A. Therefore, it is possible to suppress the image light emitted from the far display 20B from being reflected by the edge surface of the near display 20A, and a boundary portion between the background virtual image Vi2 and the virtual image V23 from standing out by the reflected light.

<Fourth Modification>

Figure 35:
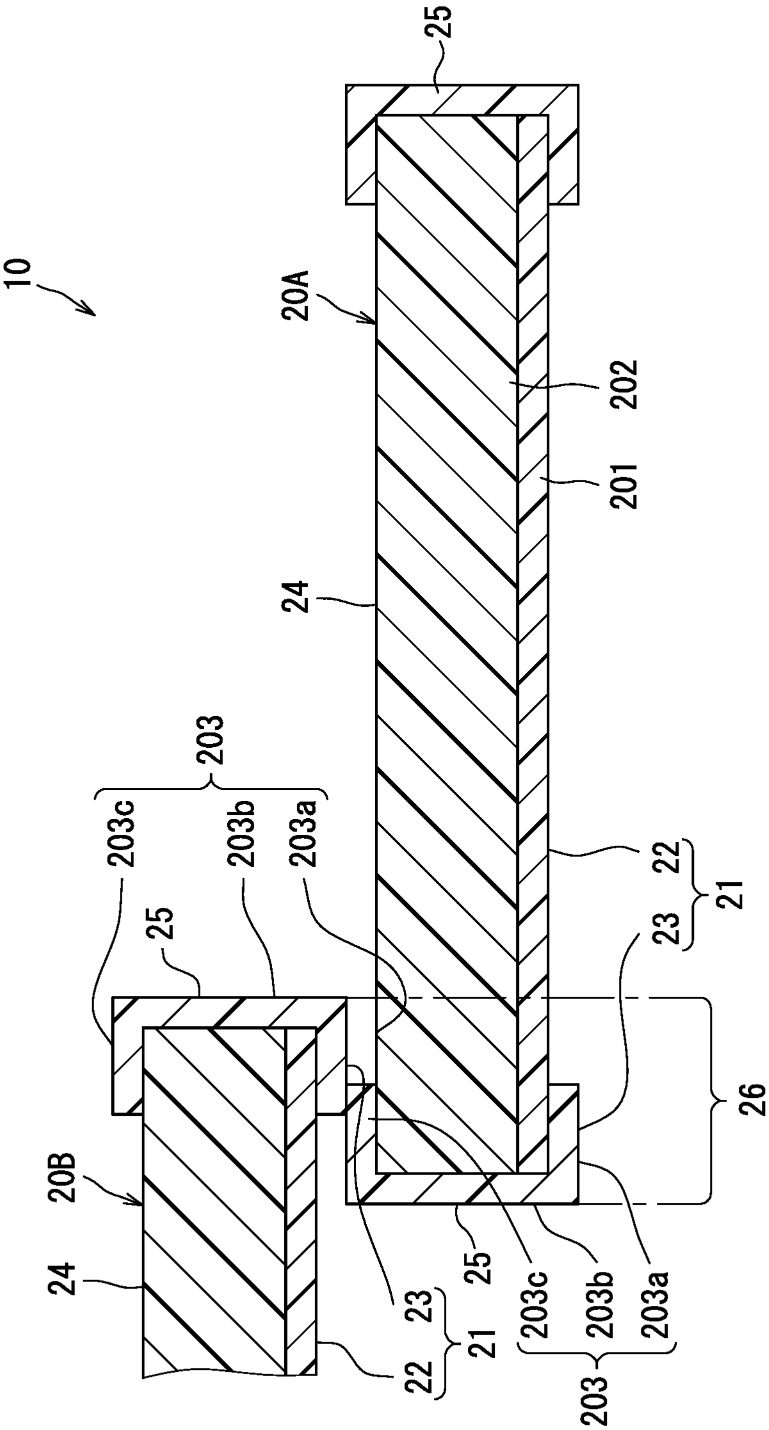
FIG. 35 is a diagram illustrating a transverse cross-sectional view of the periphery of a display overlapping portion in a fourth modification of the fifth embodiment.

In the fifth embodiment, the display frame portion 203 may have a shape extending around the display back surface 24 side. In the fourth modification, for example, as illustrated in FIG. 35, the display frame portion 203 includes a frame back surface portion 203*c* in addition to a frame front surface portion 203*a* and a frame edge portion 203*b*. The frame back surface portion 203*c* is provided on the side opposite to the frame front surface portion 203*a* by way of the display body 201. The frame back surface portion 203*c* is superimposed on the back surface side plate surface of the display body 201. In the display frame portion 203, the frame edge portion 203*b* connects the frame front surface portion 203*a* and the frame back surface portion 203*c*. The frame back surface portion 203*c* forms a part of the display back surface 24.

In the display overlapping portion 26, the frame back surface portion 203*c* of the near display 20A is disposed at a position going across the display surface 22 and the frame surface 23 of the far display 20B in the device width direction. That is, at least a part of the frame back surface portion 203*c* of the near display 20A faces the display surface 22 of the far display 20B. In this configuration, even if the image light from the display surface 22 of the far display 20B is emitted not on the display body 201 but on the frame back surface portion 203*c* in the near display 20A, the image light is hardly reflected by the frame back surface portion 203*c*. Therefore, the boundary portion between the virtual image Vi and the virtual image V23 can be suppressed from standing out by the image light emitted from the far display 20B.

OTHER EMBODIMENTS

The disclosure of this specification is not limited to the illustrated embodiments. The disclosure encompasses the illustrated embodiments and variations based thereon by those skilled in the art. For example, the disclosure is not limited to the combination of components and elements shown in the embodiments, and various modifications can be made. The disclosure can be implemented by various combinations. The disclosure can have additional portions that can be added to the embodiments. The disclosure encompasses those in which components and elements of the embodiments are omitted. The disclosure encompasses replacement or combination of components and elements between one embodiment and another. The disclosed technical scope is not limited to the description of the embodiments. The disclosed technical scope is indicated by the description of the Claims, and should be understood to include meanings equivalent to the description of the Claims and all modifications within the scope.

<Configuration Group A>

In each of the above embodiments, the heat dissipation fin 44 may not be covered by the instrument panel 102 or the visor hood 50. For example, the heat dissipation fin 44 may be exposed from at least one of the hood front surface 51 and the hood back surface 52 in the vehicle interior 101. The heat dissipation fin 44 may be superimposed on at least one of the display front surface 21 and the display back surface 24. The position of the heat dissipation fin 44 may not be between the display and the hood basal end portion 58. The heat dissipation fin 44 may not be individually provided for each heat dissipation plate portion 41. For example, one heat dissipation fin 44 may be provided for the plurality of heat dissipation plate portions 41. Specifically, one heat dissipation fin 44 may be bridged across a plurality of heat dissipation plate portions 41. One display unit 70 may have a plurality of heat dissipation fins 44.

In each of the above embodiments, a configuration for enhancing heat dissipation efficiency by the heat dissipating part 40 may be provided with respect to the image display device 10. For example, a heat transfer member that performs heat transfer such as a heat pipe may be connected to at least one of the heat dissipation plate portion 41 and the heat dissipation extending portion 42. In this configuration, the heat of the heat dissipation plate portion 41 and the heat dissipation extending portion 42 is released via the heat transfer member, so that the heat dissipation efficiency of the heat dissipating part 40 is easily improved. In addition, an electric fan that blows air toward the heat dissipation extending portion 42 may be provided. In this configuration, the heat dissipation efficiency of the heat dissipation extending portion 42 is easily improved by air blowing from the electric fan.

In the above embodiments, in the heat dissipating part 40, a part of the heat dissipation plate portion 41 may be exposed to the outside of the visor hood 50. In this configuration, the heat of the display 20 is easily released from the heat dissipation plate portion 41 to the outside of the visor hood 50. The heat dissipating part 40 may not be exposed to the outside of the visor hood 50 as long as heat of the display 20 can be released to the outside of the visor hood 50. For example, the heat dissipation extending portion such as the heat dissipation fin 44 may not be exposed to the outside of the visor hood 50 as long as it extends from the heat dissipation plate portion 41 toward the outside of the visor hood 50. In this configuration as well, as long as the heat dissipation extending portion is located at a position spaced apart from the display heat can be dissipated from the heat dissipation extending portion toward the outside of the display 20. The heat radiating extending portion may not include the fin portion as long as the heat dissipation extending portion extends from the heat dissipation plate portion 41 toward the outside of the visor hood 50. For example, the heat dissipation extending portion may be formed in a plate shape similarly to the heat dissipation plate portion 41.

In each of the above embodiments, the heat dissipation plate portions 41 individually provided on the two adjacent displays 20 may be in contact with each other. A plurality of heat dissipation plate portions 41 may be individually provided on one display 20. The heat dissipation plate portion 41 may not be individually provided for each display 20. For example, one heat dissipation plate portion 41 may be bridged across two adjacent displays 20. As long as a plurality of heat dissipation plate portions 41 are arranged side by side along the recessed bottom surface 54, the arrangement direction of these heat dissipation plate portions 41 may not be the device width direction. Even if the heat dissipation plate portion 41 is not individually provided for each display 20, the worker can attach and detach only some heat dissipation plate portions 41 together with the display 20 when attaching and detaching one display 20 to and from the visor hood 50. One display unit 70 may include a plurality of heat dissipation plate portions 41. The heat dissipation plate portion 41 may be fixed to the display 20 by a fixing tool such as a screw. The heat dissipation plate portion 41 may not be fixed to the display 20 as long as it is superimposed on the display back surface 24.

In each of the above embodiments, the heat dissipation plate portion 41 and the heat dissipation fin 44 may be integrally formed. In this configuration, when attaching and detaching the heat dissipation plate portion 41 to and from the visor hood the worker attaches and detaches the heat dissipation fin 44 to and from the visor hood 50 together with the heat dissipation plate portion 41. The heat dissipating part may not include one of the heat dissipation plate portion 41 and the heat dissipation fin 44. In a configuration in which the heat dissipating part 40 does not include the heat dissipation plate portion 41, the display back surface 24 may be joined to the heat insulating part 30. Furthermore, the image display device 10 may not include the heat dissipating part 40.

In each of the above embodiments, the heat insulating parts 30 individually provided for the two adjacent displays 20 may be in contact with each other. A plurality of heat insulating parts 30 may be individually provided on one display 20. The heat insulating part 30 may not be individually provided for each display 20. For example, one heat insulating part 30 may be bridged across two adjacent displays 20. As long as a plurality of heat insulating parts 30 are arranged side by side along the recessed bottom surface 54, the arrangement direction of the heat insulating parts 30 may not be the device width direction. Even if the heat insulating part 30 is not individually provided for each display 20, the worker can attach and detach only some heat insulating parts 30 together with the display 20 when attaching and detaching one display 20 to and from the visor hood 50. One display unit 70 may include a plurality of heat insulating parts 30. The heat insulating part 30 may be fixed to the visor hood with a fixing tool such as a screw as long as the heat insulating part is fixed with respect to the recessed bottom surface 54. The heat insulating part 30 may be fixed to the heat dissipation plate portion 41 by a fixing tool such as a screw.

In each of the above embodiments, as long as the display 20 is fixed to the recessed bottom surface 54 through the heat insulating part 30, the display may be fixed to the heat insulating part 30 by a fixing tool such as a screw. The display 20 may be fixed to the recessed bottom surface 54 by the heat insulating part 30 in a state where the display 20 is relatively displaceable with respect to the recessed bottom surface 54. A plurality of displays 20 may be arranged side by side in the up-down direction. In the configuration in which the image display device 10 is installed in the vehicle interior 101 such that the device width direction is the vehicle front-rear direction, a plurality of displays 20 are preferably arranged side by side in the vehicle front-rear direction. The image display device 10 may include only one display 20.

<Configuration Group B>

In each of the above embodiments, the heat insulating part 30 may not be joined to the recessed bottom surface 54 as long as it is fixed to the visor hood 50. For example, the heat insulating part 30 may be fixed to the visor hood 50 with a fixing tool such as a screw. Furthermore, the heat insulating part 30 may be formed of an air layer. Furthermore, the heat insulating part 30 may be provided between the display back surface 24 and the heat dissipation plate portion 41. In addition, the heat dissipation plate portion 41 may be provided between the recessed bottom surface 54 and the heat insulating part 30.

In each of the above embodiments, the image display device 10 may not include at least one of the heat insulating part 30 and the heat dissipating part 40. In a configuration in which the image display device 10 does not include both the heat insulating part 30 and the heat dissipating part 40, the display back surface 24 may be directly joined to the recessed bottom surface 54.

In the third to fifth embodiments, in one display 20, one side end portion 25 may be disposed on the front side of the adjacent display 20, and the other side end portion 25 may be disposed on the far side of the adjacent display 20 on the opposite side. In this configuration, the displays 20 are inclined with respect to the width direction of the image display device 10.

<Common>

In each of the above embodiments, the display 20 may not have the frame surface 23. That is, the entire display front surface 21 may be the display surface 22.

In each of the above embodiments, the image display device 10 may not include the hood cover 60. For example, in the second embodiment, in the configuration in which the image display device 10 does not include the hood cover 60, the plurality of display front surfaces 21 form one visual recognition surface Sv as a whole.

In each of the above embodiments, as long as the display back surface 24 is covered by the visor hood 50, the display 20 may not be accommodated inside the hood recess 53. For example, in a configuration in which the visor hood 50 does not include the hood recess 53, the visor hood 50 may cover the display back surface 24 in a state in which the hood front surface 51 is opposing the display back surface 24. In this configuration, the hood front surface 51 corresponds to the case opposing surface. Furthermore, the heat insulating part 30 and the heat dissipation plate portion 41 may not be accommodated inside the hood recess 53 as long as they are provided between the case opposing surface and the display back surface 24.

In each of the above embodiments, the display 20 serving as the image display unit may not be the self-luminous type. For example, the display 20 may be an image element of a liquid crystal panel, or the like. In a configuration in which the display 20 is not a self-luminous type, the image display device 10 preferably includes a light source such as an LED as a backlight.

In each of the above embodiments, the two adjacent display surfaces 22 may be arranged at positions shifted in the device thickness direction regardless of whether the two adjacent displays 20 are arranged at positions overlapping each other in the device thickness direction.

In the first and third to fifth embodiments, a plurality of reflecting mirrors 15 may be arranged side by side in the device width direction. In this configuration, the plurality of reflection surfaces 16 form one visual recognition surface Sv as a whole. The virtual image display unit may not be the reflecting mirror 15 as long as the image V can be displayed as the virtual image Vi. The virtual image display unit may be, for example, a half mirror or a lens member. The half mirror is a member that has a mirror surface and performs both transmission and reflection of image light entering the mirror surface. In the vehicle 100, a windshield may be used as the virtual image display unit. For example, the windshield is irradiated with image light from the image display device In this configuration, the inner surface of the windshield reflects the image light to display the virtual image Vi. Therefore, at least a part of the inner surface of the windshield becomes the visual recognition surface Sv.

In each of the above embodiments, the visor hood 50 may be attached to an interior panel different from the instrument panel 102. Examples of the interior panel include a door panel and a ceiling panel in addition to the instrument panel 102. The visor hood 50 may be attached to a door panel or a ceiling panel.

In each of the above embodiments, the control unit 80 is provided by a control system including at least one computer. The control system includes at least one processor (hardware processor) that is hardware. The hardware processor can be provided by the following (i), (ii), or (iii).

(i) The hardware processor may be a hardware logic circuit. In this case, the computer is provided by a digital circuit including a large number of programmed logic units (gate circuits). The digital circuit may include a memory that stores at least one of a program and data. The computer may be provided by an analog circuit. The computer may be provided by a combination of a digital circuit and an analog circuit.

(ii) The hardware processor may be at least one processor core that executes a program stored in at least one memory. In this case, the computer is provided by at least one memory and at least one processor core. The processor core is, for example, referred to as a CPU. The memory is also referred to as a storage medium. The memory is a non-transitory tangible storage medium that non-transiently stores "at least one of a program and data" readable by a processor.

(iii) The hardware processor may be a combination of the above (i) and the above (ii). (i) and (ii) are arranged on different chips or on a common chip.

That is, at least one of the means and the function provided by the control unit 80 can be provided by only hardware, only software, or a combination thereof.

In each of the above embodiments, examples of the vehicle 100 on which the display devices 10 and 11 are mounted include an automatic driving vehicle capable of both automatic driving and manual driving. Examples of the vehicle 100 on which the display devices 10 and 11 are mounted include a passenger car, a bus, a construction work vehicle, and an agricultural machine vehicle. Examples of the moving body on which the display devices 10 and 11 are mounted include a train, an airplane, and a ship in addition to the vehicle 100. The display devices 10 and 11 may be mounted on a vehicle. Examples of the vehicle include a moving vehicle such as the vehicle 100 and a stationary vehicle such as a game machine. The display devices 10 and 11 may be mounted on stationary facility or equipment. The display devices 10 and 11 may be applied to a portable information terminal such as a head mounted display. In a configuration in which the display devices 10 and 11 are mounted on an equipment or a facility different from the vehicle 100, at least a part of the finished surface of the equipment or facility may be formed by the visor hood 50.

<Features of Configuration Group A>

In the display device, when the back surface of the back cover is irradiated with an external light such as sunlight, external light heat due to the external light may be applied to the display through the back cover. In this case, there is a concern that the temperature of the display excessively rises due to external light heat, and an abnormality occurs in the display. On the other hand, the configuration disclosed in the present specification includes the features of the configuration group A as follows. According to the following feature A1, abnormality can be suppressed from occurring in the image display unit in the display device. The reference signs in parentheses described in the followings are an example indicating a correspondence relationship with specific means described in embodiments described above, and do not limit the technical scope.

<Feature A1>

A display device (10) includes: an image display unit (20) having a display surface (22) that displays an image (V) and a display back surface (24) on a side opposite to the display surface; a display case (50) having a case opposing surface (54) opposing the display back surface and covering the display back surface; and a heat insulating part (30) that is disposed between the display back surface and the case opposing surface to restrict heat from transferring from the display case to the image display unit, and is elastically deformed or flexibly stretched and deformed in accordance with a relative displacement of the image display unit with respect to the display case. In the display device, the image display unit is fixed to the case opposing surface through the heat insulating part.

<Feature A2>

The display device as in the feature A1, further includes a heat dissipating part (40) that is interposed between the display back surface and the case opposing surface, and configured to dissipate heat of the image display unit to an outside of the display case. In the display device, the heat insulating part is elastically deformed or flexibly stretched and deformed in accordance with a relative displacement of the heat dissipating part with respect to the display case, and the image display unit is fixed to the heat insulating part through the heat dissipating part.

<Feature A3>

In the display device as in the feature A2, the heat dissipating part includes a plate-shaped heat dissipation plate portion (41) that is disposed between the display back surface and the heat insulating part and is overlaid on the display back surface, and a heat dissipation extending portion (44) that extends from the heat dissipation plate portion toward the outside of the display case.

<Feature A4>

In the display device as in the feature A3, a plurality of the heat dissipation plate portions are arranged side by side along the case opposing surface.

<Feature A5>

In the display device as in the feature A4, a plurality of the image display units are arranged side by side along the case opposing surface, and the heat dissipation plate portion is individually provided for each of the plurality of image display units.

<Feature A6>

In the display device as in the feature A4 or A5, adjacent two of the plurality of heat dissipation plate portions are disposed at positions spaced apart from each other along the case opposing surface.

<Feature A7>

In the display device as in any one of the features A3 to A6, the heat dissipation extending portion is disposed at a position spaced apart from an outer peripheral edge of the image display unit toward an outer peripheral edge of the display case.

<Feature A8>

In the display device as in any one of the features A1 to A7, a plurality of the heat insulating parts are arranged side by side along the case opposing surface.

<Feature A9>

In the display device as in the feature A8, a plurality of the image display units are arranged side by side along the case opposing surface, and the heat insulating part is individually provided for each of the plurality of image display units.

<Feature A10>

In the display device as in the feature A8 or A9, adjacent two of a plurality of the heat insulating parts are disposed at positions spaced apart from each other along the case opposing surface.

<Feature A11>

The display device as in any one of the features A1 to A10 is to be mounted on a vehicle (100), and the display case is a member attached to an interior panel (102) defining an interior of a cabin of the vehicle.

<Features of Configuration Group B>

In the display device, there is a concern that the size of the display surface is insufficient with respect to the amount of information included in the image. On the other hand, the configuration disclosed in the present specification includes the features of the configuration group B as follows. According to the following feature B1, the size of the visual recognition surface visually recognized by the viewer in the virtual image display device can be increased. The reference signs in parentheses described in the followings are an example indicating a correspondence relationship with specific means described in embodiments described above, and do not limit the technical scope.

<Feature B1>

A virtual image display device (11) that displays an image (V) as a virtual image (Vi), includes: a plurality of image display units (20, 20A, 20B) each having a display surface (22) that emits image light and displays an image; and a virtual image display unit (15) having a reflection surface (16) that reflects the image light and is visually recognized by a viewer, and displaying a virtual image with the image light reflected by the reflection surface. In the virtual image display device, the plurality of image display units are arranged side by side along the reflection surface with the respective display surfaces facing the reflection surface.

<Feature B2>

In the virtual image display device as in the feature B1, one image display unit (20A) of the two adjacent image display units (20A, 20B) is provided at a position that does not block the image light emitted from the other image display unit (20B).

<Feature B3>

In the virtual image display device as in the feature B1 or B2, a side end portion (25) of one image display unit (20A) of the two adjacent image display units (20A, 20B) is provided at a position that overlaps the other image display unit (20B) in a direction orthogonal to the reflection surface.

<Feature B4>

In the virtual image display device as in the feature B1 or B2, two adjacent image display units (20A, 20B) are arranged side by side spaced apart from each other along the reflection surface.

<Feature B5>

In the virtual image display device as in any one of the features B1 to B4, the image display unit includes a frame surface (23) that extends along an outer peripheral edge of the display surface and faces the reflection surface together with the display surface. In the plurality of image display units, the respective frame surfaces have the same color or a similar color.

<Feature B6>

The virtual image display device as in any one of the features B1 to B5, further includes a display case (50) that covers a display back surface (24) on a side opposite to a display surface of the image display unit in a state of being bridged across a plurality of image display units.

<Feature B7>

In the virtual image display device as in the feature B6, the virtual image display device is mounted on a vehicle (100), and the display case is bridged across two adjacent pillars (108) through a windshield (106) of the vehicle.

<Feature B8>

In the virtual image display device as in any one of the features B1 to B7, the virtual image display device is mounted on a vehicle (100), and the display case is a member attached to an interior panel (102) defining an interior of a cabin (101) of the vehicle.

What is claimed is:

1. A display device comprising:

an image display unit having a display surface that displays an image and a display back surface on a side opposite to the display surface;

a display case having a case opposing surface opposing the display back surface and covering the display back surface;

a heat insulating part disposed between the display back surface and the case opposing surface to restrict heat from transferring from the display case to the image display unit, the heat insulating part being elastically deformed or flexibly stretched and deformed in accordance with a relative displacement of the image display unit with respect to the display case, the heat insulating part being more easily deformable than the display case; and a heat dissipating part including a heat dissipation plate portion interposed between the display back surface and the case opposing surface to dissipate heat of the image display unit to an outside of the display unit, the heat dissipation plate portion fixed to the case opposing surface through the heat insulating part, wherein a plurality of the heat insulating parts are arranged side by side along the case opposing surface, spaced apart from each other, and individually fixed to the case opposing surface, a plurality of the heat dissipation plate portions are arranged side by side along the case opposing surface, spaced apart from each other, and disposed individually and correspondingly to the plurality of the heat insulating parts, a plurality of the image display units are arranged side by side along the case opposing surface, spaced apart from each other, and disposed individually and correspondingly to the plurality of the heat dissipation plate portions and the plurality of the heat insulating parts, and each of the plurality of the image display units is fixed to a corresponding heat dissipation plate thereby to be fixed to the case opposing surface through a corresponding heat insulating part.

2. The display device according to claim 1, the heat insulating part is elastically deformed or flexibly stretched and deformed in accordance with a relative displacement of the heat dissipating part with respect to the display case, and the image display unit is fixed to the heat insulating part through the heat dissipating part.

3. The display device according to claim 2, wherein the heat dissipating part includes:

a heat dissipation extending portion that extends from the heat dissipation plate portions toward the outside of the display case.

4. The display device according to claim 3, wherein the heat dissipation extending portion is disposed at a position spaced apart from outer peripheral edges of the image display units toward an outer peripheral edge of the display case.

5. The display device according to claim 1, wherein the display device is to be mounted on a vehicle, and the display case is a member attached to an interior panel defining an interior of a cabin of the vehicle.

6. The display device according to claim 1, wherein the display case has a case recess defined by the case opposing surface as a bottom surface and a side wall surface extending from the case opposing surface, and each of the heat insulating parts is adhered to both the case opposing surface and the corresponding heat dissipation plate portion, without being adhered to the side wall surface, to hold the case opposing surface and the corresponding heat dissipation plate portion.

7. The display device according to claim 1, wherein each of the heat insulating parts is elastically deformed or flexibly stretched and deformed in accordance with a relative displacement of a corresponding heat dissipation plate portion with respect to the display case, and the plurality of heat insulating parts individually hold the image display units so that the plurality of image display units are displaceable separately from each other with respect to the display case.

8. The display device according to claim 6, wherein each of the heat insulating parts is elastically deformed or flexibly stretched and deformed in accordance with a relative displacement of a corresponding heat dissipation plate portion with respect to the display case, and the plurality of heat insulating parts individually hold the image display units so that the plurality of image display units are displaceable separately from each other with respect to the display case.

* * * * *